United States Patent
Kanda et al.

(10) Patent No.: US 6,916,714 B2
(45) Date of Patent: Jul. 12, 2005

(54) METHOD OF MANUFACTURING A SEMICONDUCTOR DEVICE, IN WHICH A HIGH-BREAKDOWN-VOLTAGE MOS TRANSISTOR AND A LOW-BREAKDOWN-VOLTAGE MOS TRANSISTOR ARE FORMED ON AN IDENTICAL SEMICONDUCTOR SUBSTRATE AND SEMICONDUCTOR DEVICE MANUFACTURED THEREBY

(75) Inventors: Atsushi Kanda, Suwa (JP); Yasushi Haga, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 158 days.

(21) Appl. No.: 10/210,053

(22) Filed: Aug. 2, 2002

(65) Prior Publication Data
US 2003/0034531 A1 Feb. 20, 2003

(30) Foreign Application Priority Data
Aug. 10, 2001 (JP) ...................................... 2001-243209

(51) Int. Cl.$^7$ .......................................... H01L 21/8234
(52) U.S. Cl. ..................................................... 438/275
(58) Field of Search ................................... 438/199, 275

(56) References Cited

U.S. PATENT DOCUMENTS 4,329,186 A * 5/1982 Kotecha et al. ............. 438/286
4,735,914 A * 4/1988 Hendrickson et al. ...... 438/276
6,436,776 B2 * 8/2002 Nakayama et al. ......... 438/305

FOREIGN PATENT DOCUMENTS

| JP | 08-204021 A | 8/1996 |
|---|---|---|
| JP | 10-242462 A | 9/1998 |
| JP | 11-126900 | 5/1999 |
| JP | 2001-185723 A | 7/2001 |

* cited by examiner

Primary Examiner—W. David Coleman
(74) Attorney, Agent, or Firm—Oliff & Berridge, PLC

(57) ABSTRACT

A procedure of manufacturing a semiconductor device according to the present invention first creates a gate electrode on a center portion of a gate oxide film formed on a substrate, forms a silicon oxide film over the whole surface of the substrate including the gate electrode, and etches the whole face of the silicon oxide film, so as to form a side wall of the silicon oxide film on a side face of the gate electrode. The procedure then implants an impurity ion according to a channel of a target MOS transistor, so as to specify a drain area and a source area. In the process of specifying the drain area and the source area, a resist is formed in advance on at least a peripheral portion of the gate oxide film in a high-breakdown-voltage MOS transistor, so as to prevent implantation of the impurity ion in an under-layer region below the peripheral portion of the gate oxide film. This arrangement enables both a high-breakdown-voltage MOS transistor and a low-breakdown-voltage MOS transistor to be efficiently formed on an identical substrate without damaging the characteristics of the respective transistors.

2 Claims, 35 Drawing Sheets

METHOD OF MANUFACTURING A SEMICONDUCTOR DEVICE, IN WHICH A HIGH-BREAKDOWN-VOLTAGE MOS TRANSISTOR AND A LOW-BREAKDOWN-VOLTAGE MOS TRANSISTOR ARE FORMED ON AN IDENTICAL SEMICONDUCTOR SUBSTRATE AND SEMICONDUCTOR DEVICE MANUFACTURED THEREBY

BACKGROUND OF THE INVENTION

1. Field of the Invention

The present invention relates to a method of manufacturing a semiconductor device, in which both a high-breakdown-voltage MOS (Metal Oxide Semiconductor) transistor and a low-breakdown-voltage MOS transistor having different drain breakdown voltages are formed on an identical substrate, and also to a semiconductor device manufactured by this method.

2. Description of the Related Art

An integrated circuit for actuating, for example, an imaging element, an LCD, or a print head (hereinafter referred to as the 'actuation IC') generally includes an actuation output module with a high-breakdown-voltage MOS transistor, which is driven by a power supply voltage of 10 or greater volts and has a high withstanding breakdown voltage between a drain and a source (hereinafter may be referred to as the 'drain breakdown voltage'), and a logic module with a low-breakdown-voltage MOS transistor, which is driven by a power supply voltage of several or less volts and has a low drain breakdown voltage, for controlling the actuation output module. In the description below, the MOS transistor may be simply called the transistor.

In the actuation IC, it is preferable that the high-breakdown-voltage transistor and the low-breakdown-voltage transistor are formed on an identical substrate. The simplest method of forming such transistors of different withstanding breakdown voltages on an identical substrate is to separately form the respective transistors according to different processes. The method first forms one of the high-breakdown-voltage transistor and the low-breakdown-voltage transistor on a substrate, and subsequently forms the other transistor on the same substrate.

The method of separately forming the high-breakdown-voltage transistor and the low-breakdown-voltage transistor, however, significantly increases the total number of manufacturing steps, thus worsening the production efficiency and increasing the manufacturing cost.

There is accordingly a demand for efficiently forming a high-breakdown-voltage transistor and a low-breakdown-voltage transistor on an identical substrate without damaging the characteristics of the respective transistors.

SUMMARY OF THE INVENTION

The object of the present invention is thus to provide a technique of efficiently forming a high-breakdown-voltage transistor and a low-breakdown-voltage transistor on an identical substrate without damaging the characteristics of the respective transistors.

In order to attain at least part of the above and the other related objects, the present invention is directed to a first method of manufacturing a semiconductor device, in which a high-breakdown-voltage MOS transistor and a low-breakdown-voltage MOS transistor having different drain breakdown voltages are formed on an identical semiconductor substrate. The first method includes the steps of: (1) creating a gate electrode on a center portion of a gate oxide film formed on the substrate, forming a silicon oxide film over the whole surface of the substrate including the gate electrode, and etching the whole face of the silicon oxide film, so as to form a side wall of the silicon oxide film on a side face of the gate electrode; and (2) implanting an impurity ion according to a channel of a target MOS transistor, so as to specify a drain area and a source area. The step (2) includes a step of forming a resist in advance on at least a peripheral portion of the gate oxide film in the high-breakdown-voltage MOS transistor, so as to prevent implantation of the impurity ion in an under-layer region below the peripheral portion of the gate oxide film.

The first method of the present invention enables the high-breakdown-voltage MOS transistor and the low-breakdown-voltage MOS transistor to be efficiently formed on an identical substrate. Especially the technique of the present invention effectively prevents implantation of the impurity ion, which is used to specify the drain area and the source area, into the under-layer region below the peripheral portion of the gate oxide film in the high-breakdown-voltage MOS transistor. This arrangement effectively prevents a decrease in drain breakdown voltage and keeps the favorable breakdown voltage properties of the high-breakdown-voltage MOS transistor.

In one preferable application of the present invention, the first method further includes the step of: (3) forming a metal film composed of a specific metal on the gate electrode, the drain area, and the source area and carrying out heat treatment to make respective semiconductor elements defining the gate electrode, the drain area, and the source area fused with the specific metal of the metal film for silicidation. The step (3) includes a step of forming a protective film in advance on at least the peripheral portion of the gate oxide film, so as to prevent silicidation of semiconductor in the under-layer region below the peripheral portion of the gate oxide film.

This application of the first method effectively prevents silicidation of the semiconductor in the under-layer region below the peripheral portion of the gate oxide film in the high-breakdown-voltage MOS transistor. The arrangement thus further prevents a decrease in drain breakdown voltage, due to the silicidation of the semiconductor in the under-layer region below the peripheral portion of the gate oxide film.

The present invention is also directed to a second method of manufacturing a semiconductor device, in which a high-breakdown-voltage MOS transistor and a low-breakdown-voltage MOS transistor having different drain breakdown voltages are formed on an identical semiconductor substrate. The second method includes the steps of: (1) creating a gate electrode on a center portion of a gate oxide film formed on the substrate, forming a silicon oxide film over the whole surface of the substrate including the gate electrode, and etching the whole face of the silicon oxide film, so as to form a side wall of the silicon oxide film on a side face of the gate electrode; (2) implanting an impurity ion according to a channel of a target MOS transistor, so as to specify a drain area and a source area; (3) forming a metal film composed of a specific metal on the gate electrode, the drain area, and the source area and carrying out heat treatment to make respective semiconductor elements defining the gate electrode, the drain area, and the source area fused with the specific metal of the metal film for silicidation. The step (3) includes a step of forming a protective film in advance on at least a peripheral portion of the gate oxide film in the high-breakdown-voltage MOS transistor, so as to prevent silicidation of semiconductor in an under-layer region below the peripheral portion of the gate oxide film.

The second method of the present invention enables the high-breakdown-voltage MOS transistor and the low-breakdown-voltage MOS transistor to be efficiently formed on an identical substrate. Especially the technique of the present invention effectively prevents silicidation of the semiconductor in the under-layer region below the peripheral portion of the gate oxide film in the high-breakdown-voltage MOS transistor. The arrangement thus further prevents a decrease in drain breakdown voltage, due to the silicidation of the semiconductor in the under-layer region below the peripheral portion of the gate oxide film, and keeps the favorable breakdown voltage properties of the high-breakdown-voltage MOS transistor.

The present invention is further directed to a first semiconductor device in which a high-breakdown-voltage MOS transistor and a low-breakdown-voltage MOS transistor having different drain breakdown voltages are formed on an identical semiconductor substrate. The high-breakdown-voltage MOS transistor includes: a gate oxide film formed on the substrate; a gate electrode created on a center portion of the gate oxide film; and a protective film covering a peripheral portion of the gate oxide film.

The protective film covers an area from the peripheral portion of the gate oxide film to a peripheral end on the surface of the gate electrode.

The present invention is also directed to a second semiconductor device in which a high-breakdown-voltage MOS transistor and a low-breakdown-voltage MOS transistor having different drain breakdown voltages are formed on an identical semiconductor substrate. Here surface of a gate electrode of the high-breakdown-voltage MOS transistor other than a peripheral end of the gate electrode is silicidated.

These and other objects, features, aspects, and advantages of the present invention will become more apparent from the following detailed description of the preferred embodiment with the accompanying drawings.

DESCRIPTION OF THE PREFERRED EMBODIMENTS

A. Basic Manufacturing Process

A basic manufacturing process of semiconductor devices is described first, as a basis for discussing a process of manufacturing the semiconductor device of the present invention. FIGS. 1 through 28 are sectional views schematically illustrating a basic manufacturing process, as a basis for discussing a process of manufacturing the semiconductor device of the present invention. This manufacturing process is an exemplified procedure of forming both a high-breakdown-voltage CMOS (Complimentary Metal Oxide Semiconductor) transistor and a low-breakdown-voltage CMOS transistor on an identical substrate. In the respective drawings, a region HV represents a high-breakdown-voltage transistor area, and a region LV represents a low-breakdown-voltage transistor area. A region HVp denotes a high-breakdown-voltage p-channel MOS transistor (hereinafter simply referred to as 'pMOS') area, and a region HVn denotes a high-breakdown-voltage n-channel MOS transistor (hereinafter simply referred to as 'nMOS') area. A region LVp denotes a low-breakdown-voltage pMOS area, and a region LVn denotes a low-breakdown-voltage nMOS area.

Figure 1:
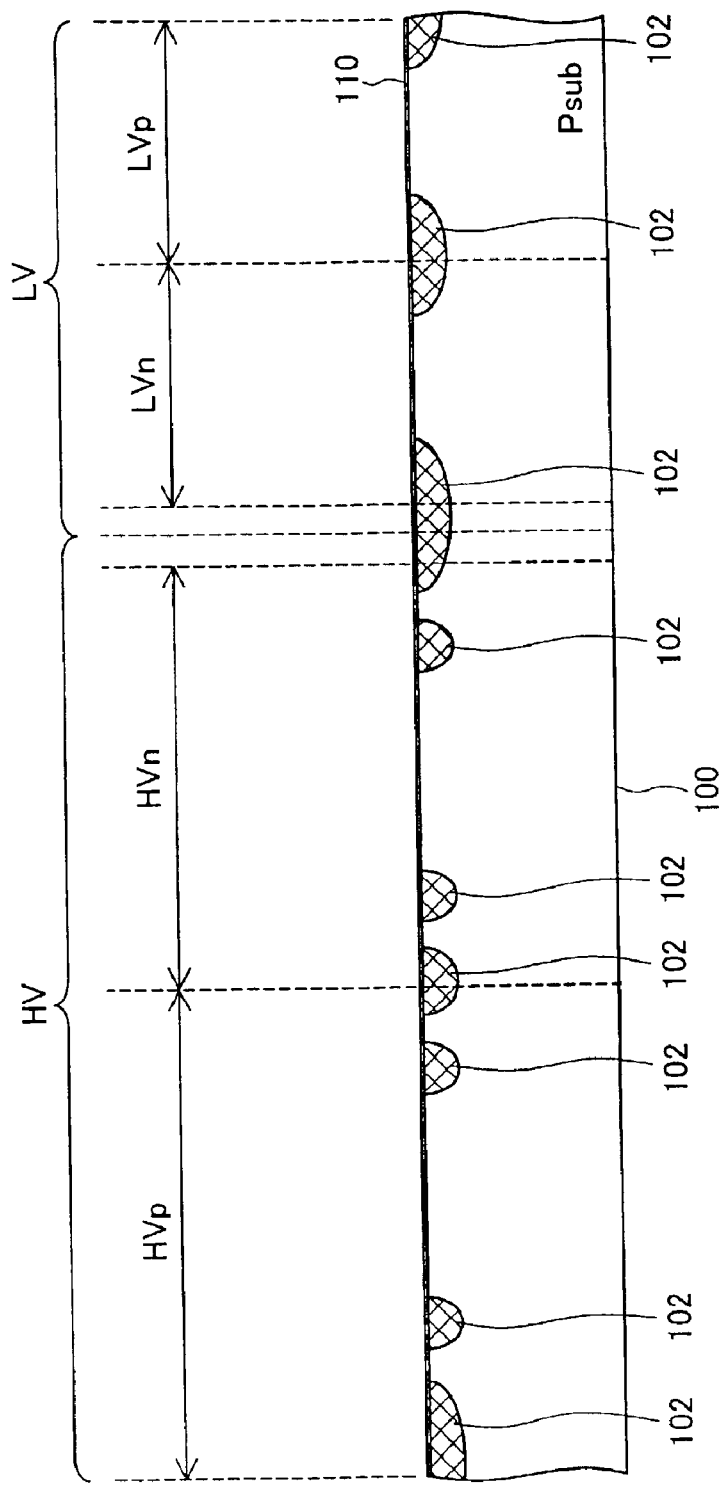
FIG. 1 is a sectional view schematically illustrating a process of forming a field oxide film on the surface of a field area.

The procedure first parts an element-forming region from a residual part (hereinafter referred to as 'field part' or 'isolation part') and forms the element-forming region in a restrictive manner. FIG. 1 is a sectional view schematically illustrating a process of forming a field oxide film on the surface of the field area. A field oxide film, LOCOS (Local oxidation of Silicon) film, 102 is formed on the surface of the field area of a p-type silicon (Si) substrate (Psub) 100, as shown in FIG. 1. In the description below, the p-type Si substrate is simply referred to as the 'substrate'. General photolithography is applied for formation of the LOCOS film 102. After formation of the LOCOS film 102, a first oxide film ($SiO_2$) 110 is formed over the whole surface of the substrate 100. The first oxide film 110 is formed, for example, by thermally oxidizing the surface of the substrate 100.

Figure 2:
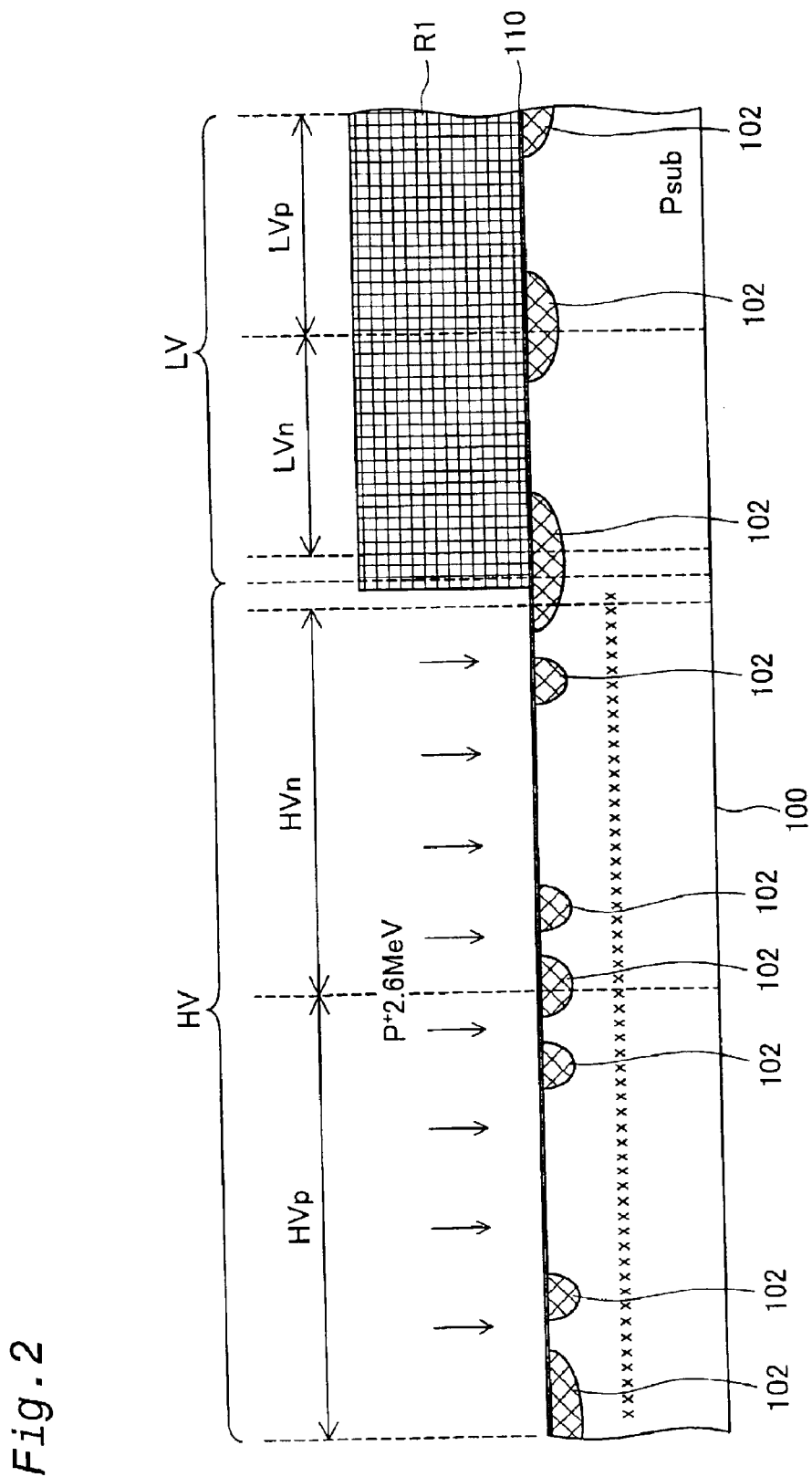
FIG. 2 is a sectional view schematically illustrating a process of forming an n well in a high-breakdown-voltage transistor area HV.
Figure 3:
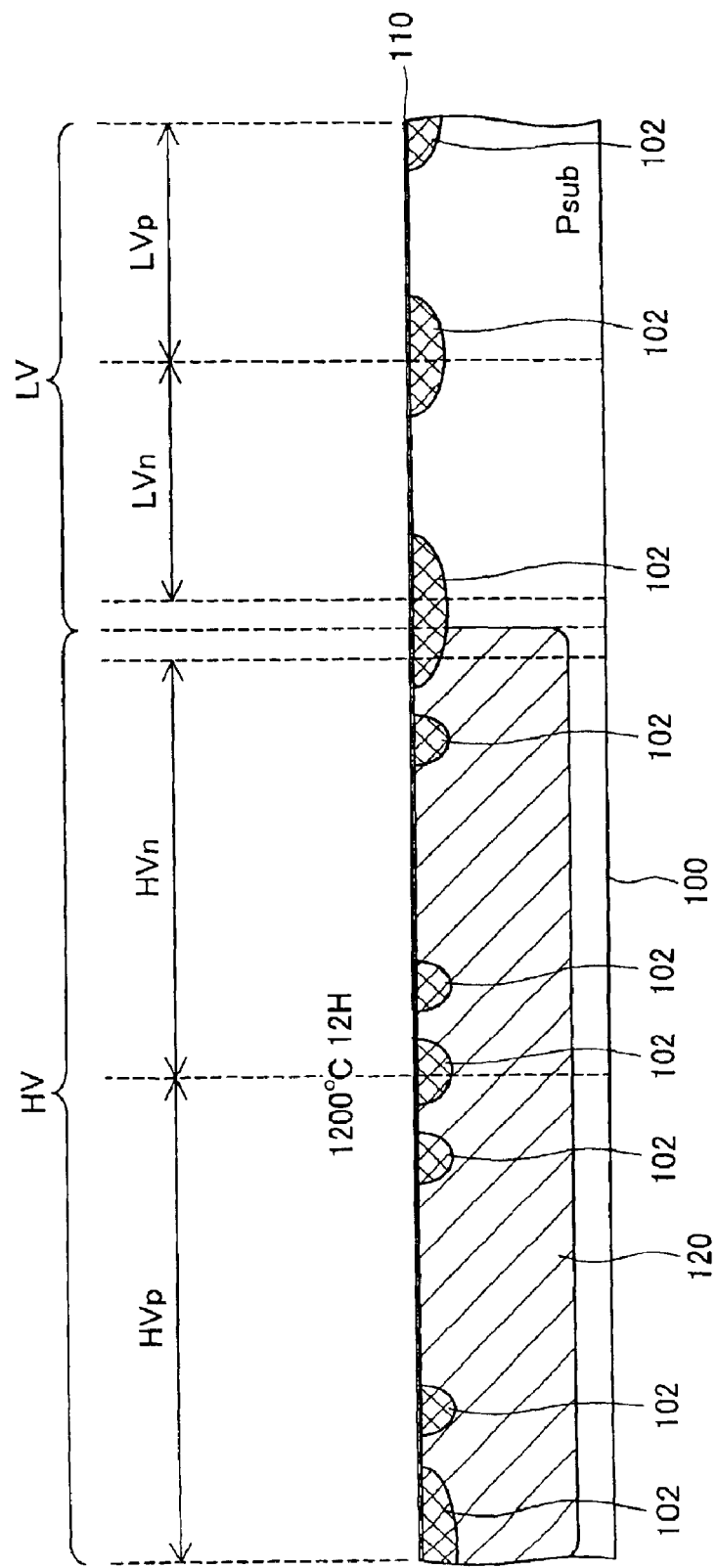
FIG. 3 is a sectional view schematically illustrating the process of forming the n well in the high-breakdown-voltage transistor area HV.

The procedure subsequently forms an n-type well (hereinafter simply referred to as 'n well') for formation of the high-breakdown-voltage pMOS in the high-breakdown-voltage transistor area HV. FIGS. 2 and 3 are sectional views schematically illustrating a process of forming an n well in the high-breakdown-voltage transistor area HV.

As shown in FIG. 2, the procedure forms a first resist R1 on a remaining area other than the high-breakdown-voltage transistor area HV. The general photolithography is applied for formation of the resist. The procedure then implants an n-type impurity ion into the opening of the first resist R1, that is, into the substrate 100 in the high-breakdown-voltage transistor area HV. In this and subsequent drawings, the symbol 'x' represents the implanted impurity. In this example, phosphorus ion ($P^+$) having an energy level of 2.6 MeV is implanted. The procedure subsequently removes the first resist R1 and carries out high-temperature heat treatment for a long time period, so as to diffuse the implanted n-type impurity ion (phosphorus) in the substrate 100 and form an n well 120 as shown in FIG. 3. In this example, the heat treatment is carried out at 1200° C. for 12 hours.

Figure 4:
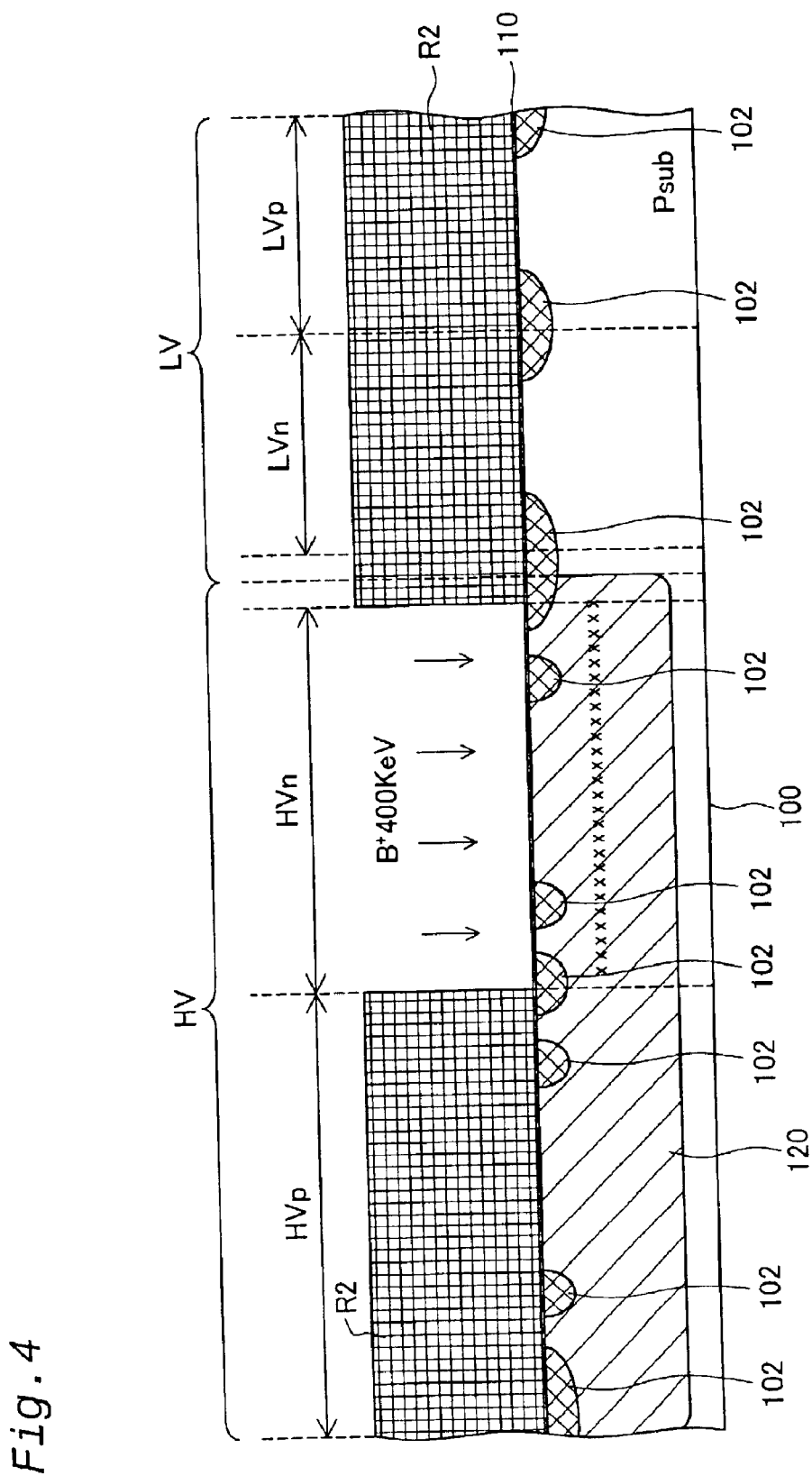
FIG. 4 is a sectional view schematically illustrating a process of forming a p well in the high-breakdown-voltage transistor area HV.
Figure 5:
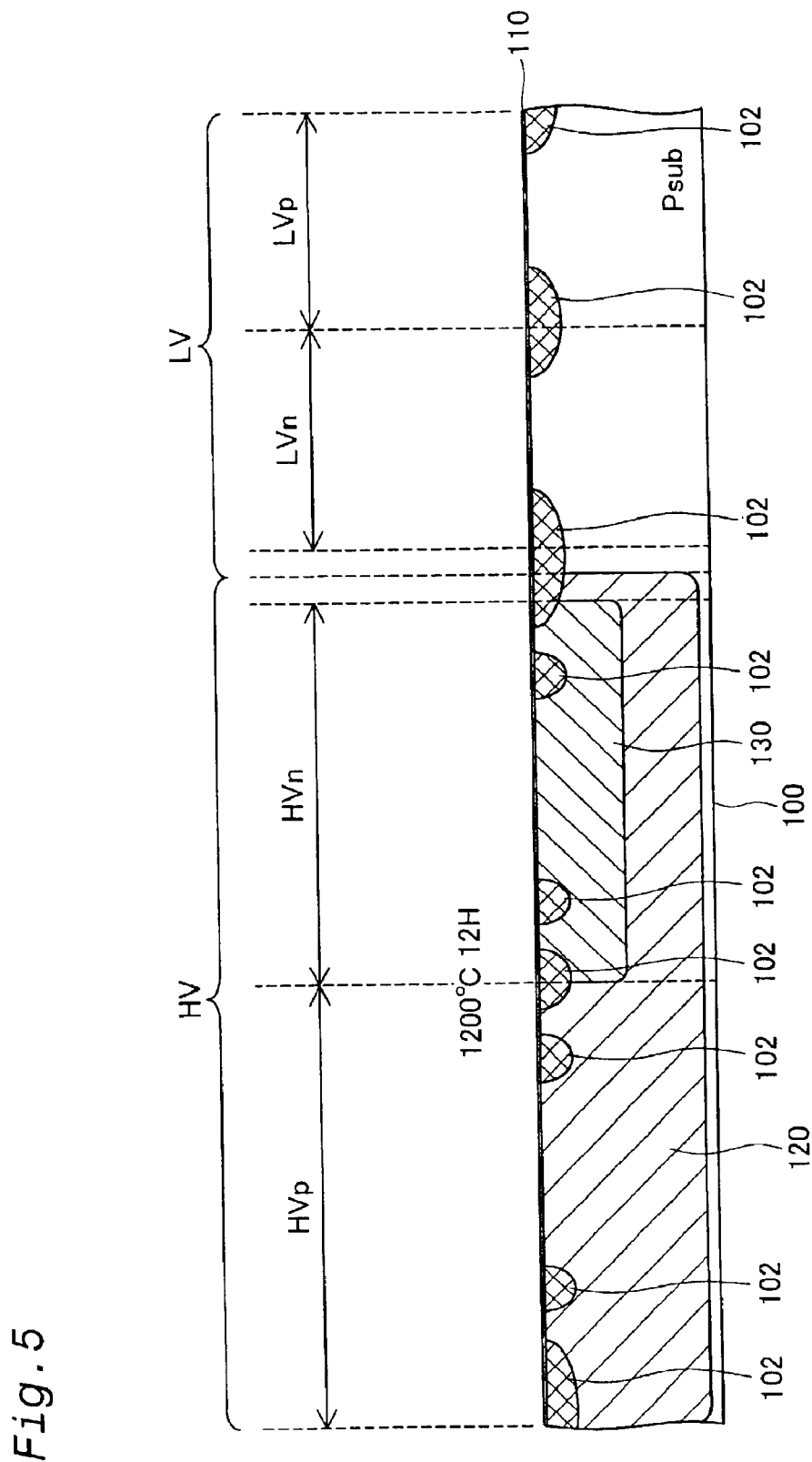
FIG. 5 is a sectional view schematically illustrating the process of forming the p well in the high-breakdown-voltage transistor area HV.

The procedure then forms a p-type well (hereinafter simply referred to as 'p well') for formation of the high-breakdown-voltage nMOS in the high-breakdown-voltage transistor area HV. FIGS. 4 and 5 are sectional views schematically illustrating a process of forming a p well in the high-breakdown-voltage transistor area HV.

As shown in FIG. 4, the procedure forms a second resist R2 on a remaining area other than the high-breakdown-voltage nMOS area HVn. The procedure then implants a p-type impurity ion into the opening of the second resist R2, that is, into the n well 120 in the high-breakdown-voltage nMOS area HVn. In this example, boron ion ($B^+$) having an energy level of 400 keV is implanted. The procedure subsequently removes the second resist R2 and carries out high-temperature heat treatment for a long time period, so as to diffuse the implanted p-type impurity ion (boron) in the n well 120 and form a p well 130 as shown in FIG. 5. In this example, the heat treatment is carried out at 1200° C. for 12 hours.

Figure 6:
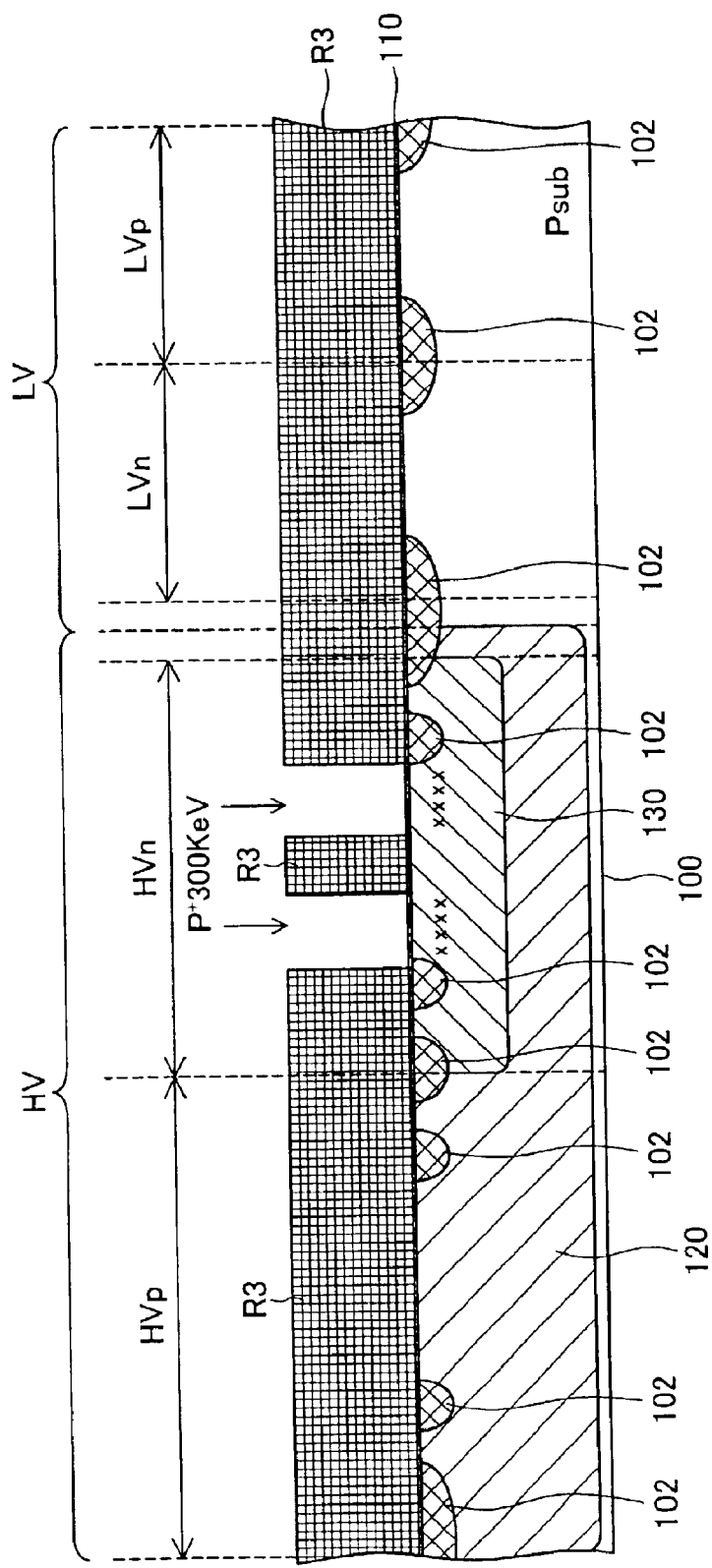
FIG. 6 is a sectional view schematically illustrating a process of forming drain and source offset areas of a high-breakdown-voltage transistor.
Figure 7:
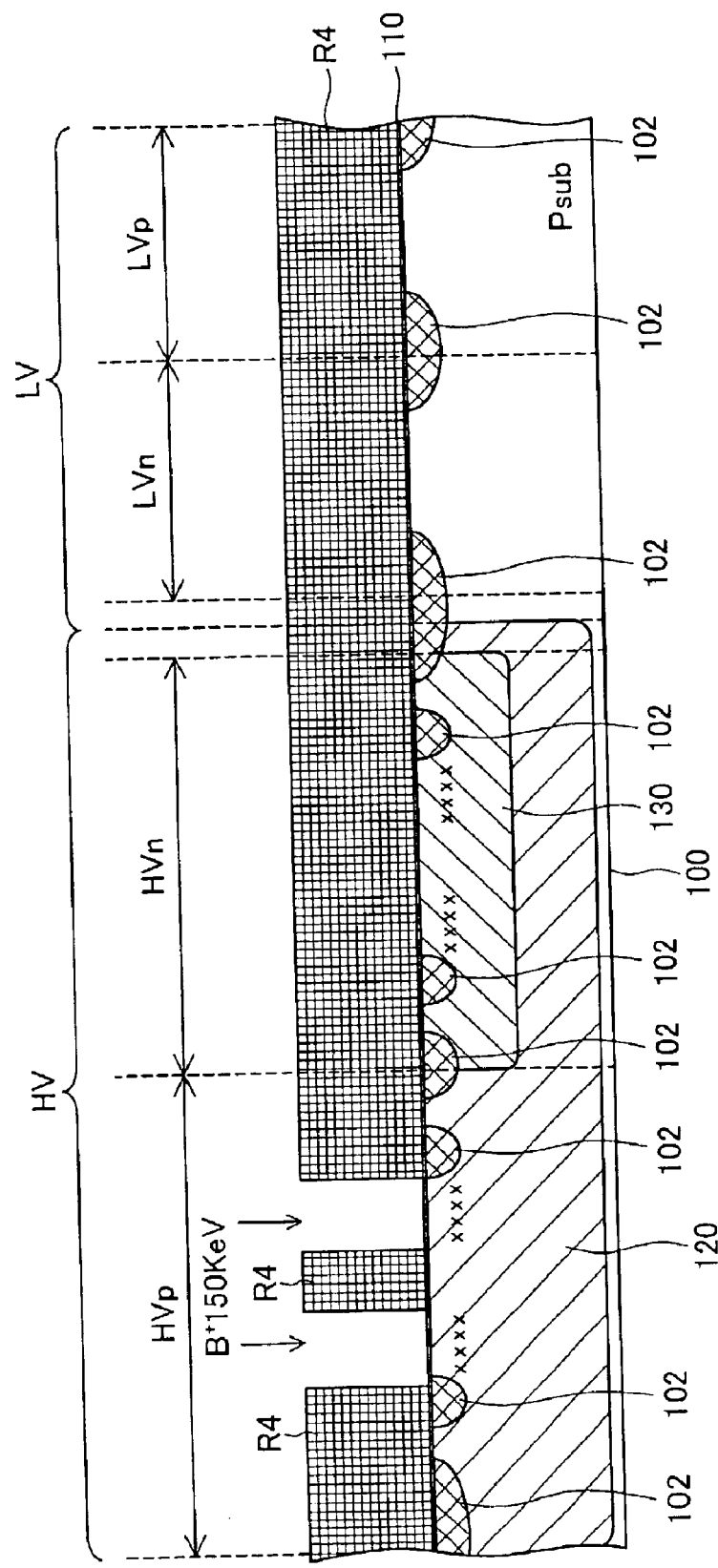
FIG. 7 is a sectional view schematically illustrating the process of forming the drain and source offset areas of the high-breakdown-voltage transistor.
Figure 8:
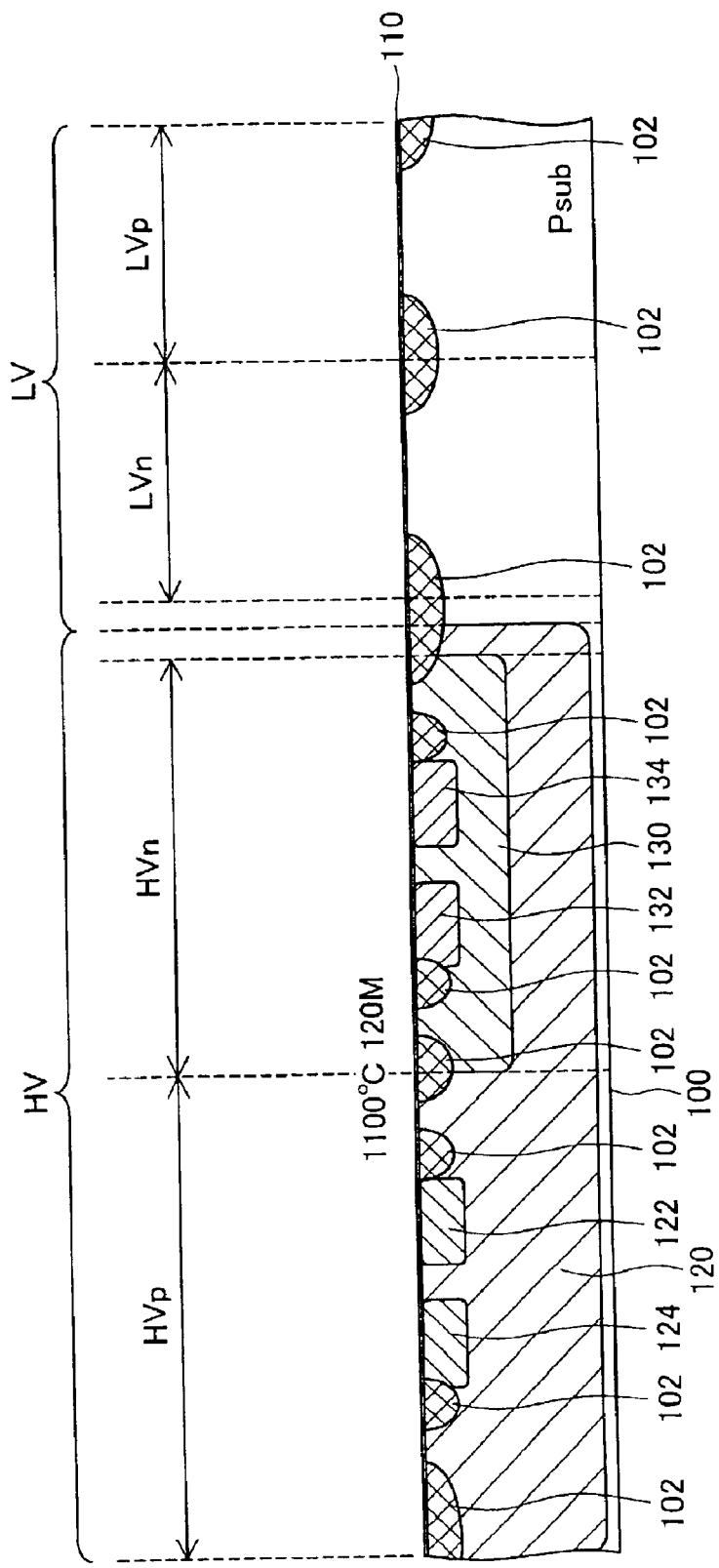
FIG. 8 is a sectional view schematically illustrating the process of forming the drain and source offset areas of the high-breakdown-voltage transistor.

The procedure then specifies a source offset area and a drain offset area (hereinafter may simply be referred to as 'offset area') for formation of a source area and a drain area of the high-breakdown-voltage transistor. FIGS. 6 through 8 are sectional views schematically illustrating a process of forming drain and source offset areas of the high-breakdown-voltage transistor.

Referring to FIG. 6, the procedure forms a third resist R3 on a remaining area other than parts corresponding to the drain and source offset areas of the high-breakdown-voltage nMOS. The procedure then implants an n-type impurity ion into the opening of the third resist R3, that is, into the p well 130 corresponding to the offset area of the high-breakdown-voltage nMOS. The third resist R3 is removed after the ion implantation. In this example, phosphorus ion ($P^+$) having an energy level of 300 keV is implanted.

Referring to FIG. 7, the procedure forms a fourth resist R4 on a remaining area other than parts corresponding to the drain and source offset areas of the high-breakdown-voltage pMOS. The procedure then implants a p-type impurity ion into the opening of the fourth resist R4, that is, into the n well 120 corresponding to the offset area of the high-breakdown-voltage pMOS. The fourth resist R4 is removed after the ion implantation. In this example, boron ion ($B^+$) having an energy level of 150 keV is implanted.

The ion implantation process shown in FIG. 6 and the ion implantation process shown in FIG. 7 may be carried out in the reverse order.

As shown in FIG. 8, the procedure carries out high-temperature heat treatment for a long time period to diffuse the implanted p-type impurity ion (boron) in the n well 120 and thereby define a drain offset area 122 and a source offset area 124 of the high-breakdown-voltage pMOS, while diffusing the implanted n-type impurity ion (phosphorus) in the p well 130 and thereby defining a drain offset area 132 and a source offset area 134 of the high-breakdown-voltage nMOS.

Figure 9:
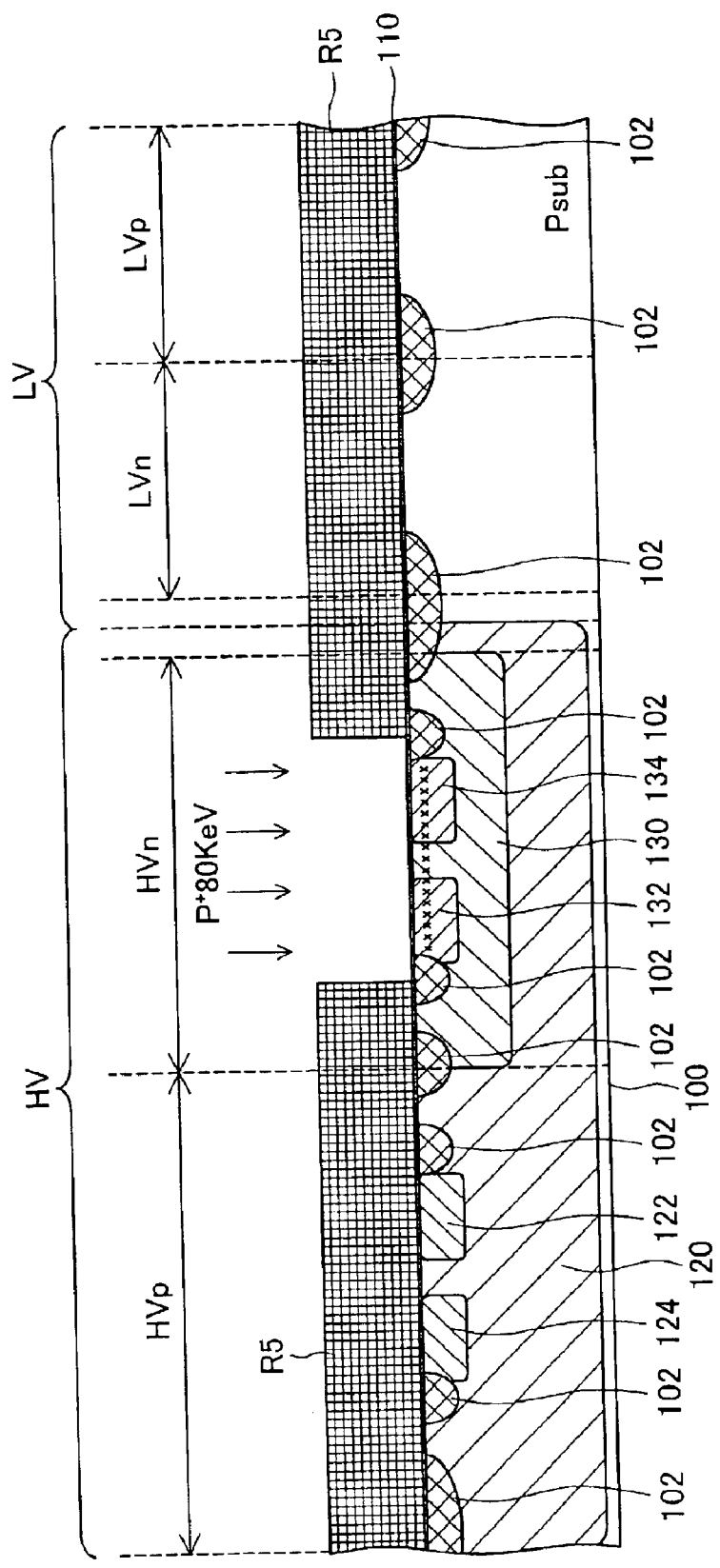
FIG. 9 is a sectional view schematically illustrating a process of implanting an n-type impurity ion into a channel area of a high-breakdown-voltage nMOS.
Figure 10:
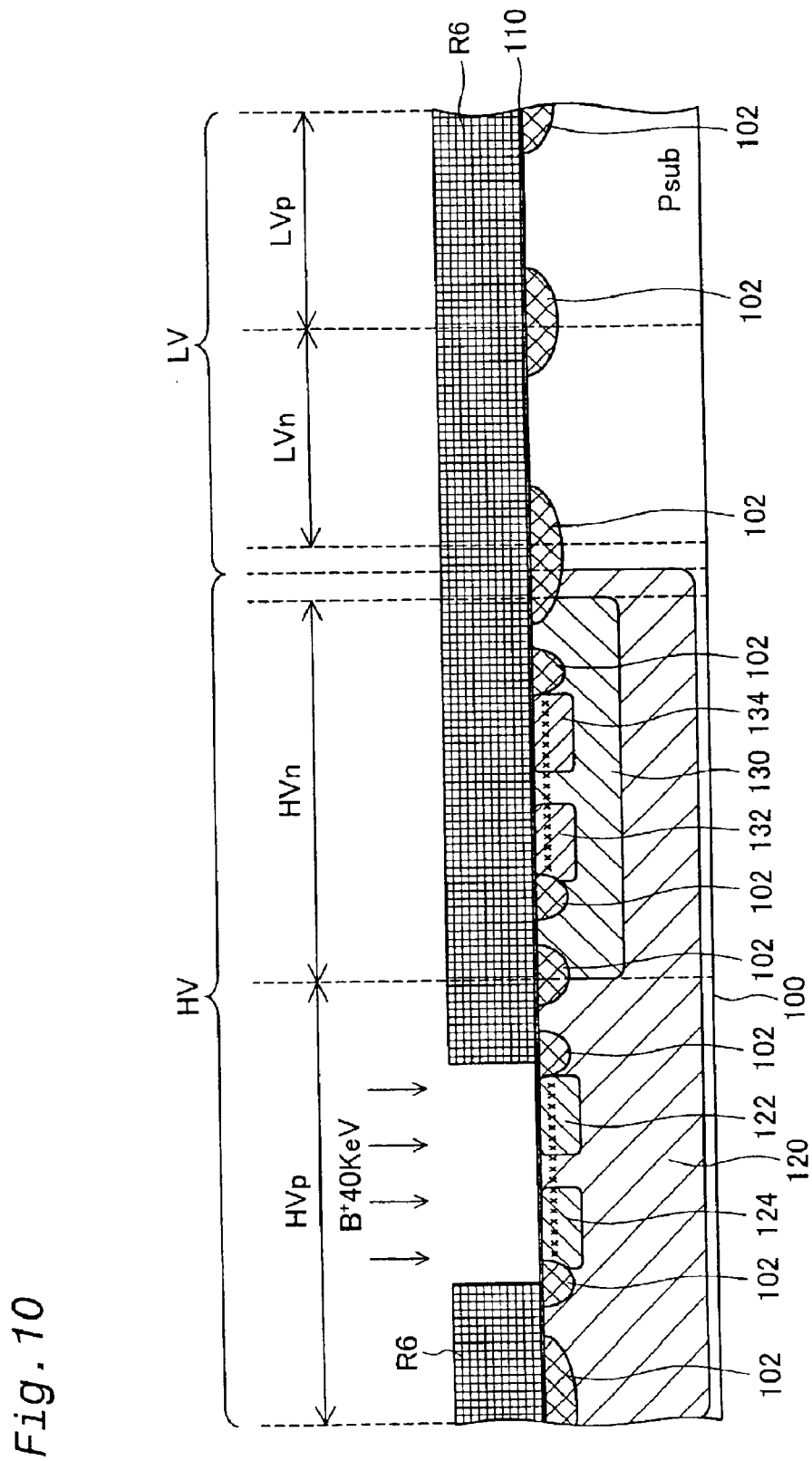
FIG. 10 is a sectional view schematically illustrating a process of implanting a p-type impurity ion into a channel area of a high-breakdown-voltage pMOS.

The procedure subsequently implants an impurity ion in a channel area, in order to regulate a threshold voltage of the high-breakdown-voltage transistor. FIG. 9 is a sectional view schematically illustrating a process of implanting an n-type impurity ion into a channel area of the high-breakdown-voltage nMOS. FIG. 10 is a sectional view schematically illustrating a process of implanting a p-type impurity ion into a channel area of the high-breakdown-voltage pMOS.

Referring to FIG. 9, the procedure forms a fifth resist R5 on a remaining area other than the high-breakdown-voltage nMOS area HVn, and implants an n-type impurity ion into the opening of the fifth resist R5, that is, into the channel area to regulate the threshold voltage of the high-breakdown-voltage nMOS. In this example, phosphorus ion ($P^+$) having an energy level of 80 keV is implanted. The fifth resist R5 is removed after the ion implantation.

Referring to FIG. 10, the procedure forms a sixth resist R6 on a remaining area other than the high-breakdown-voltage pMOS area HVp, and implants a p-type impurity ion into the opening of the sixth resist R6, that is, into the channel area to regulate the threshold voltage of the high-breakdown-voltage pMOS. In this example, boron ion ($B^+$) having an energy level of 40 keV is implanted. The sixth resist R6 is removed after the ion implantation.

The ion implantation process shown in FIG. 9 and the ion implantation process shown in FIG. 10 may be carried out in the reverse order.

Figure 11:
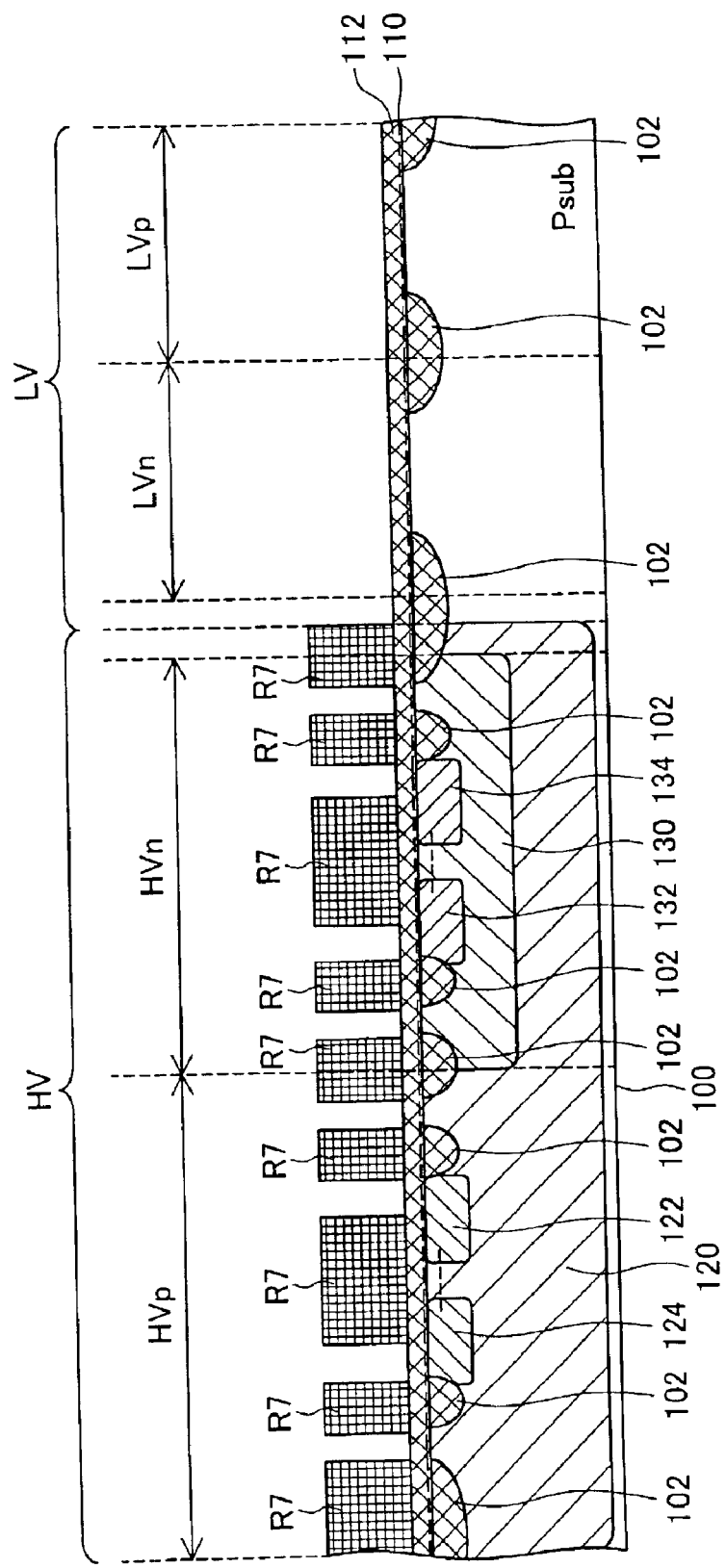
FIG. 11 is a sectional view schematically illustrating a process of forming a gate oxide film of the high-breakdown-voltage transistor.
Figure 12:
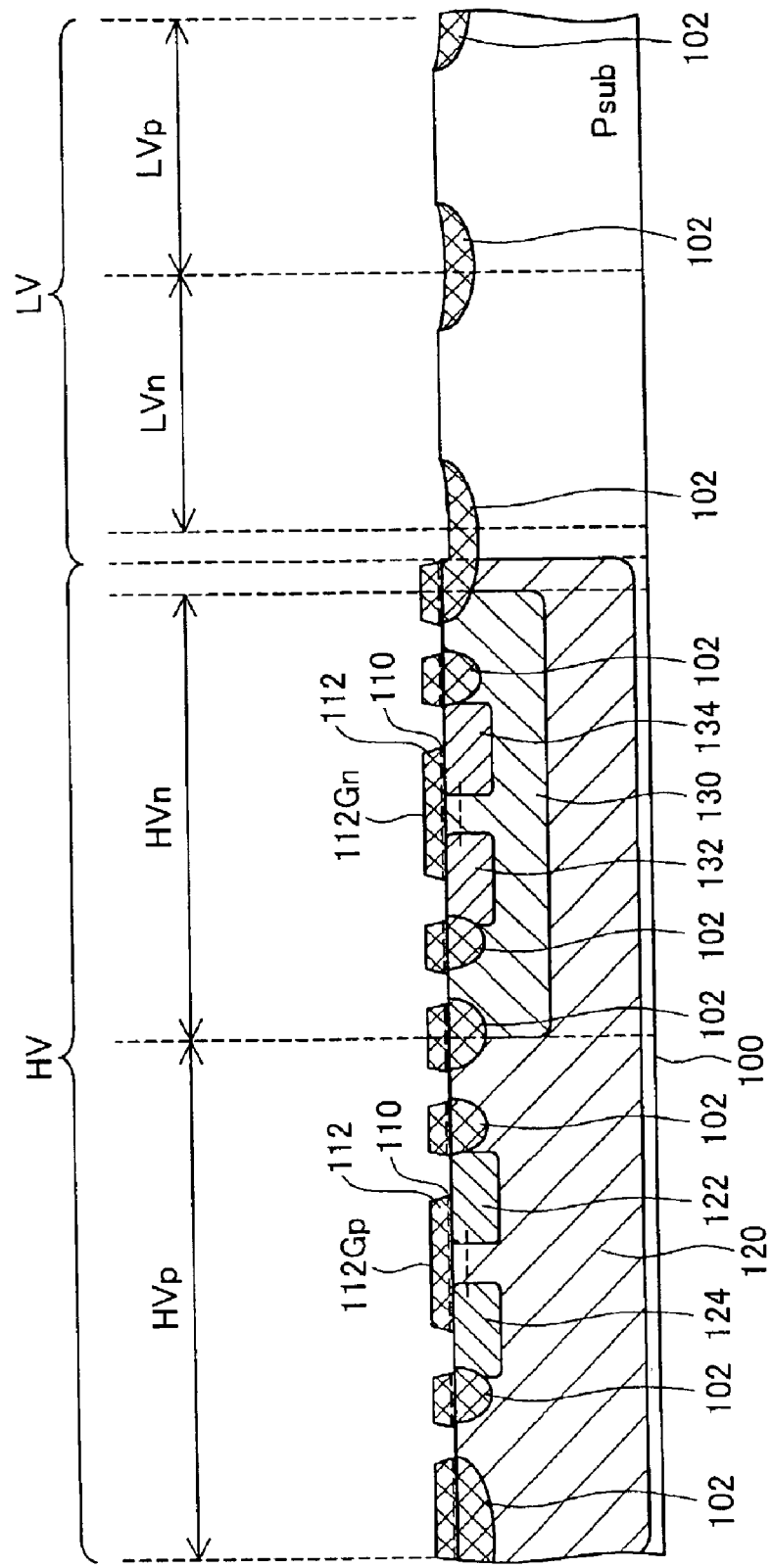
FIG. 12 is a sectional view schematically illustrating the process of forming the gate oxide film of the high-breakdown-voltage transistor.

The procedure subsequently forms a gate oxide film of the high-breakdown-voltage transistor. FIGS. 11 and 12 are sectional views schematically illustrating a process of forming a gate oxide film of the high-breakdown-voltage transistor.

As shown in FIG. 11, with a view to forming a gate oxide film of the high-breakdown-voltage transistor, the procedure first makes a second oxide film 112 deposit on the first oxide film 110. The procedure then forms a seventh resist R7 for protection of a required area as the gate oxide film, and removes non-required portions of the first and the second oxide films 110 and 112 in the opening of the seventh resist R7 by etching. This gives a gate oxide film 112Gn for the high-breakdown-voltage nMOS and a gate oxide film 112Gp for the high-breakdown-voltage pMOS as shown in FIG. 12. In FIGS. 11 and 12 and subsequent drawings, the broken lines represent the channel areas of the high-breakdown-voltage nMOS and the high-breakdown-voltage pMOS.

Both of the gate oxide films 112Gp and 112Gn are composed of the first oxide film 110 and the second oxide film 112 depositing on the first oxide film 110. The final gate oxide film has the construction including oxide films further depositing on the existing oxide films in subsequent processes. In this example, the second oxide film 112 is made to deposit on the first oxide film 110, such that the resulting gate oxide films 112Gp and 112Gn have a thickness of approximately 700 angstrom.

Figure 13:
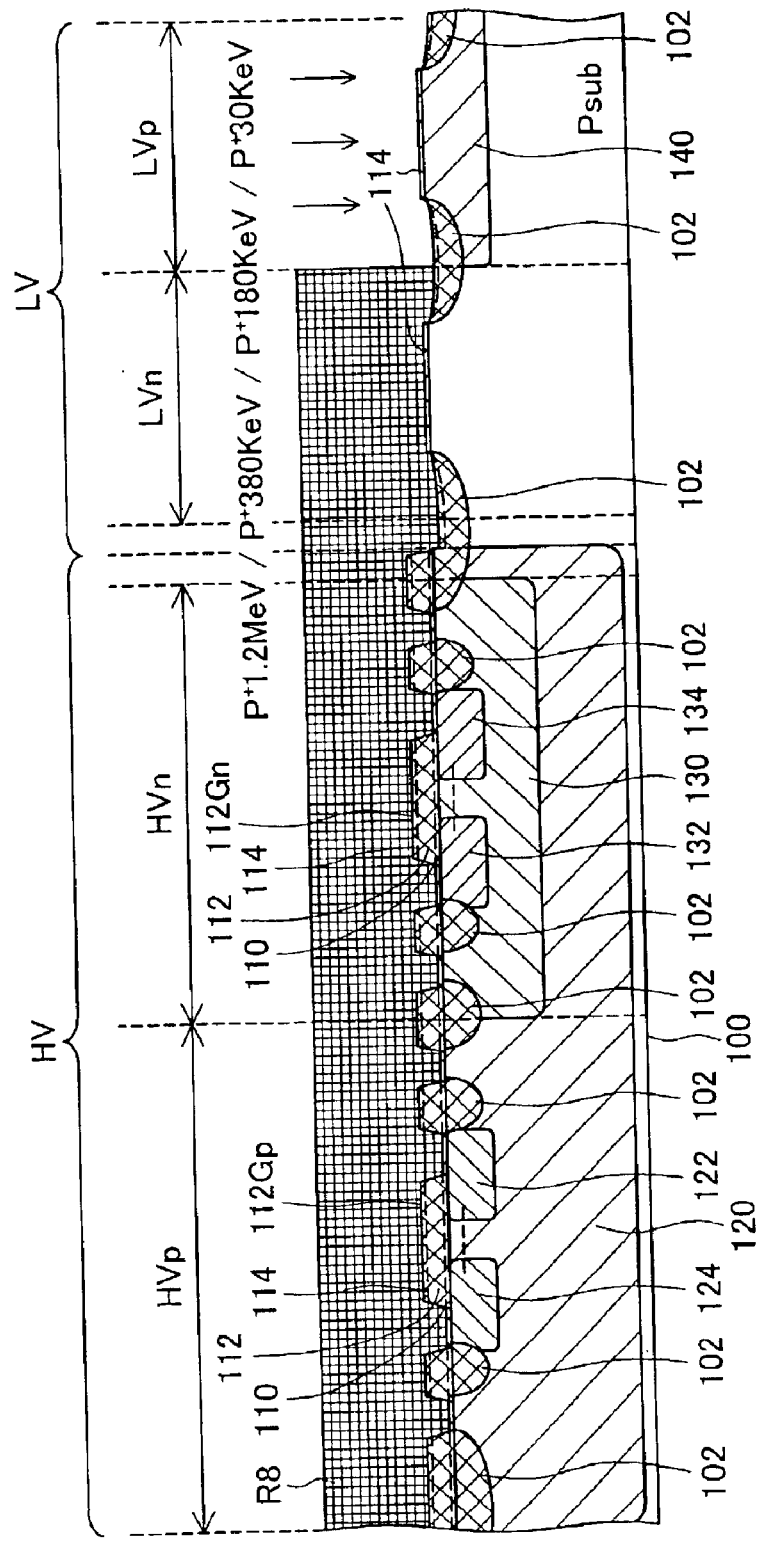
FIG. 13 is a sectional view schematically illustrating a process of forming an n well in a low-breakdown-voltage pMOS area LVp.

The procedure forms an n well for formation of the low-breakdown-voltage pMOS in the low-breakdown-voltage pMOS area LVp of the low-breakdown-voltage transistor area LV. FIG. 13 is a sectional view schematically illustrating a process of forming an n well in the low-breakdown-voltage pMOS area LVp.

Referring to FIG. 13, the procedure makes a third oxide film 114 deposit as a sacrificial oxide film over the whole surface of the substrate 100, and forms an eighth resist R8 on a remaining area other than the low-breakdown-voltage pMOS area LVp. The procedure subsequently implants an n-type impurity ion into the opening of the eighth resist R8, that is, into the substrate 100 in the low-breakdown-voltage pMOS area LVp to form an n well 140. In this example, phosphorus ion ($P^+$) having four different energy levels of 1.2 MeV, 380 keV, 180 keV, and 30 keV is implanted to form the n well 140. The eighth resist R8 is removed after the ion implantation.

Figure 14:
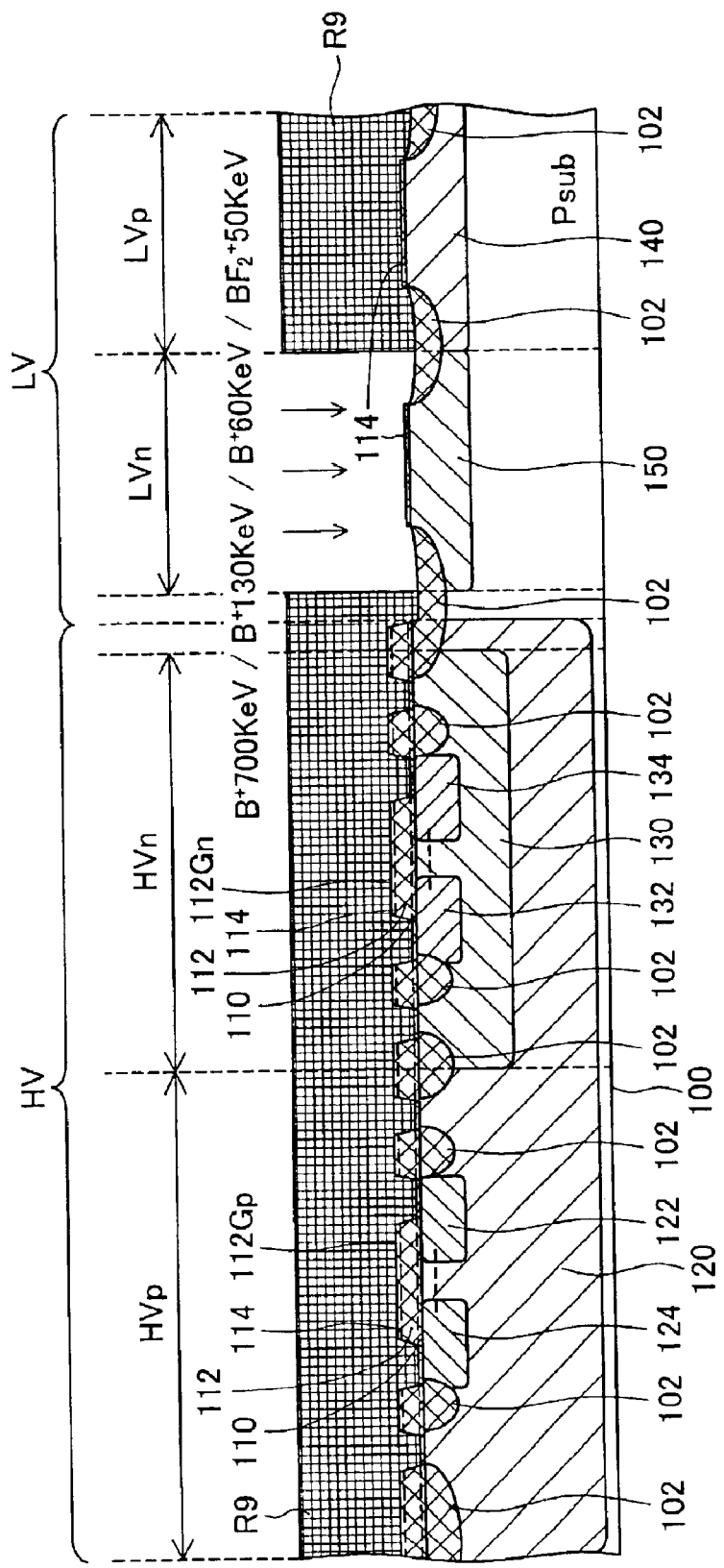
FIG. 14 is a sectional view schematically illustrating a process of forming a p well in a low-breakdown-voltage nMOS area LVn.

The procedure forms a p well for formation of the low-breakdown-voltage nMOS in the low-breakdown-voltage nMOS area LVn of the low-breakdown-voltage transistor area LV. FIG. 14 is a sectional view schematically illustrating a process of forming a p well in the low-breakdown-voltage nMOS area LVn.

Referring to FIG. 14, the procedure forms a ninth resist R9 on a remaining area other than the low-breakdown-voltage nMOS area LVn, and implants a p-type impurity ion into the opening of the ninth resist R9, that is, into the substrate 100 in the low-breakdown-voltage nMOS area LVn to form a p well 150. In this example, boron ion ($B^+$) having three different energy levels of 700 keV, 130 keV, and 60 keV and boron fluoride ion ($BF_2^+$) of an energy level of 50 keV are implanted to form the p well 150. The ninth resist R9 is removed after the ion implantation.

The process of forming the n well 140 shown in FIG. 13 and the process of forming the p well 150 shown in FIG. 14 may be carried out in the reverse order.

At the time of terminating the processes of FIGS. 13 and 14, the gate oxide film 112Gn of the high-breakdown-voltage nMOS and the gate oxide film 112Gp of the high-breakdown-voltage pMOS are composed of the first through the third oxide films 110, 112, and 114. In this example, the third oxide film 114 is made to deposit in a thickness of approximately 100 angstrom. The gate oxide film 112Gn of the high-breakdown-voltage nMOS and the gate oxide film 112Gp of the high-breakdown-voltage pMOS are formed in a thickness of approximately 760 to 770 angstrom.

Figure 15:
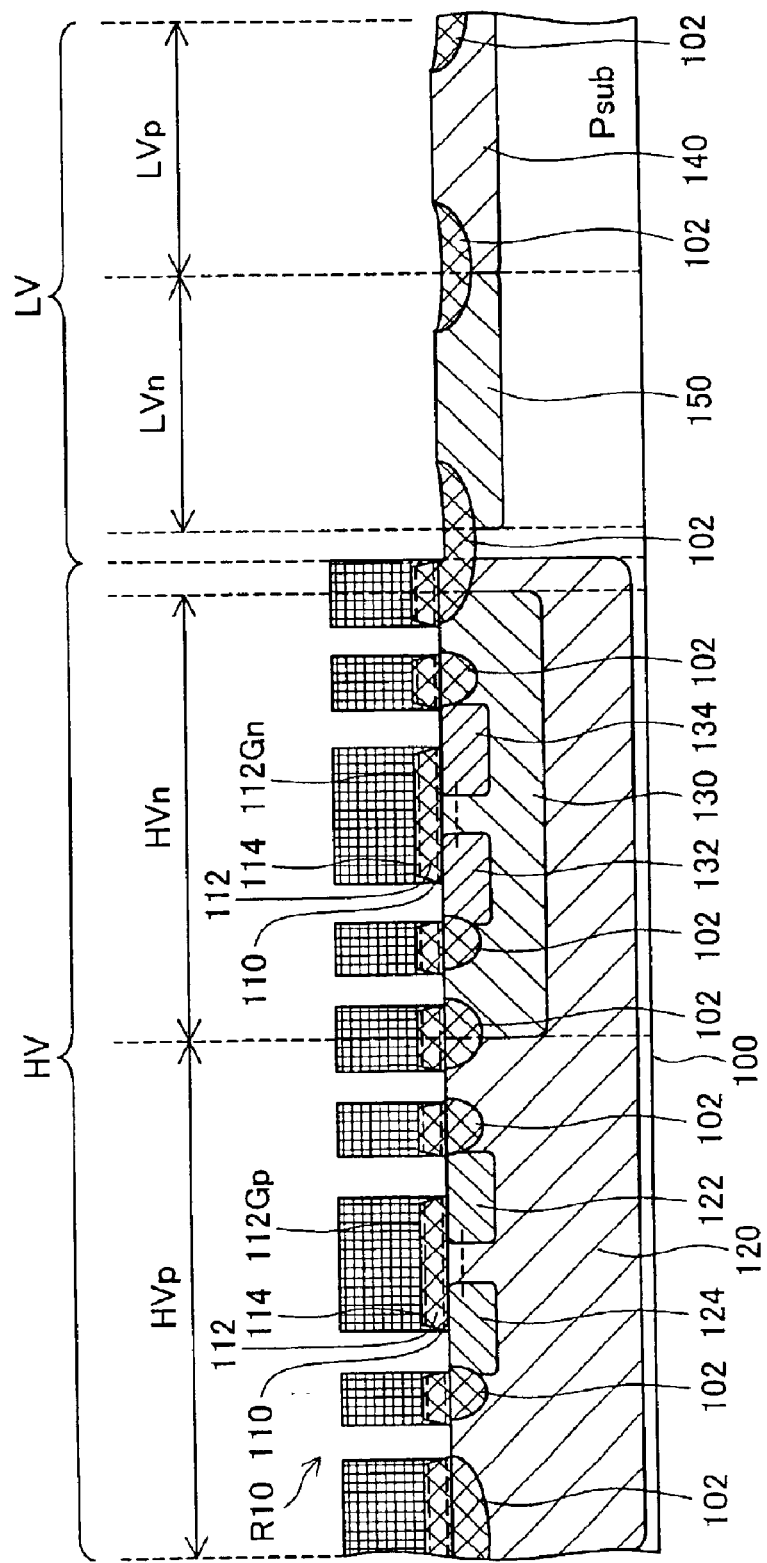
FIG. 15 is a sectional view schematically illustrating a process of forming a gate oxide film of a low-breakdown-voltage transistor.
Figure 16:
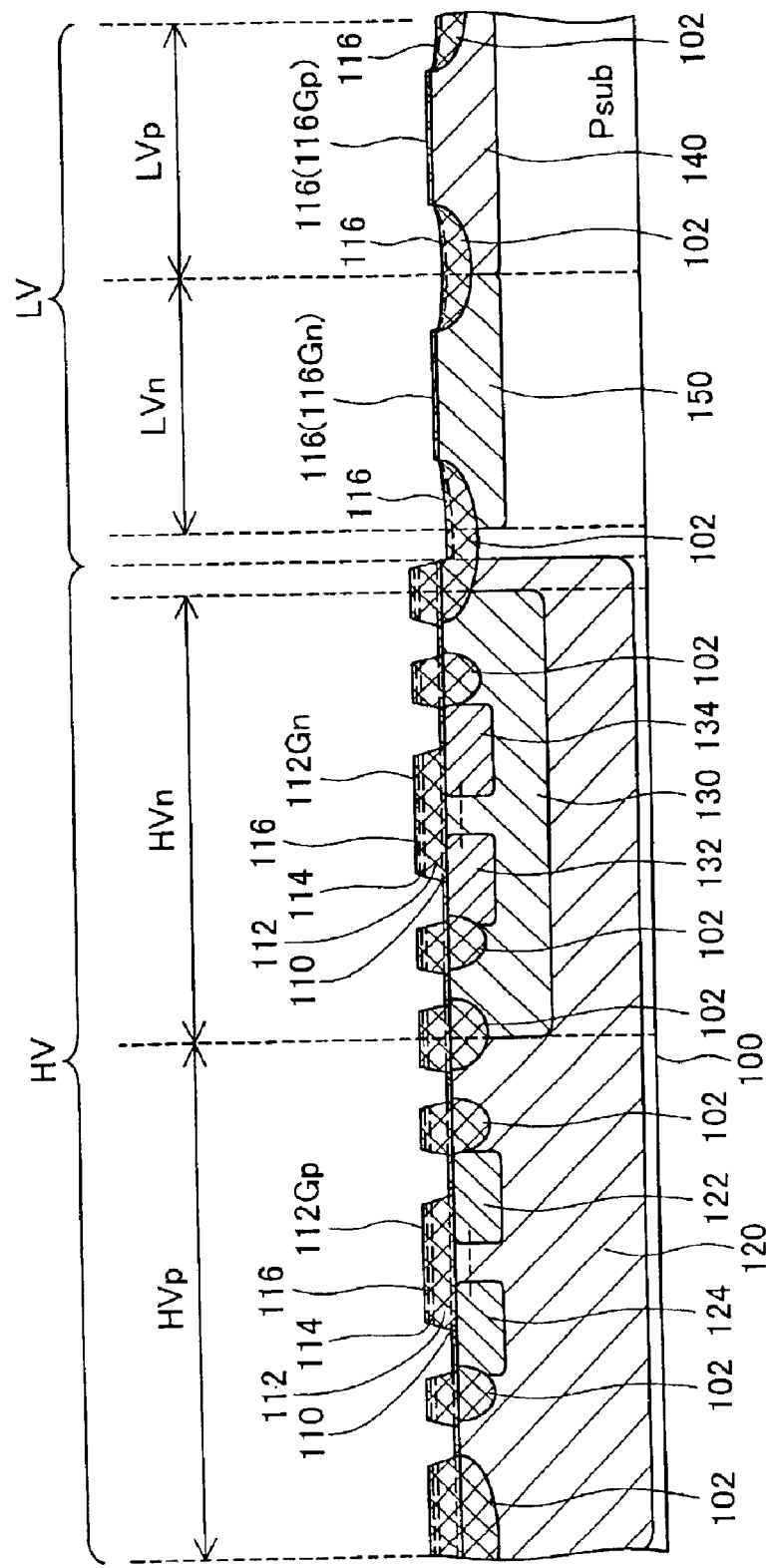
FIG. 16 is a sectional view schematically illustrating the process of forming the gate oxide film of the low-breakdown-voltage transistor.

The procedure subsequently forms a gate oxide film of the low-breakdown-voltage transistor. FIGS. 15 and 16 are sectional views schematically illustrating a process of forming a gate oxide film of the low-breakdown-voltage transistor.

As shown in FIG. 15, the procedure forms a tenth resist R10 and removes non-required portions of the third oxide film 114 by etching. The procedure subsequently removes the tenth resist R10 and makes a fourth oxide film 116 deposit over the whole surface of the substrate 100 as shown in FIG. 16. The fourth oxide films 116 formed on the element-forming regions (that is, the areas interposed between the LOCOS-film areas 102) in the low-breakdown-voltage nMOS area LVn and the low-breakdown-voltage pMOS area LVp respectively give gate oxide films 116Gn and 116Gp of the low-breakdown-voltage transistor.

The gate oxide film 112Gn of the high-breakdown-voltage nMOS and the gate oxide film 112Gp of the high-breakdown-voltage pMOS are composed of the first through the fourth oxide films 110, 112, 114, and 116. In this example, the fourth oxide film 116 is made to deposit in a thickness of approximately 70 angstrom. The gate oxide film 112Gn of the high-breakdown-voltage nMOS and the gate oxide film 112Gp of the high-breakdown-voltage pMOS are formed in a thickness of approximately 800 angstrom.

Figure 17:
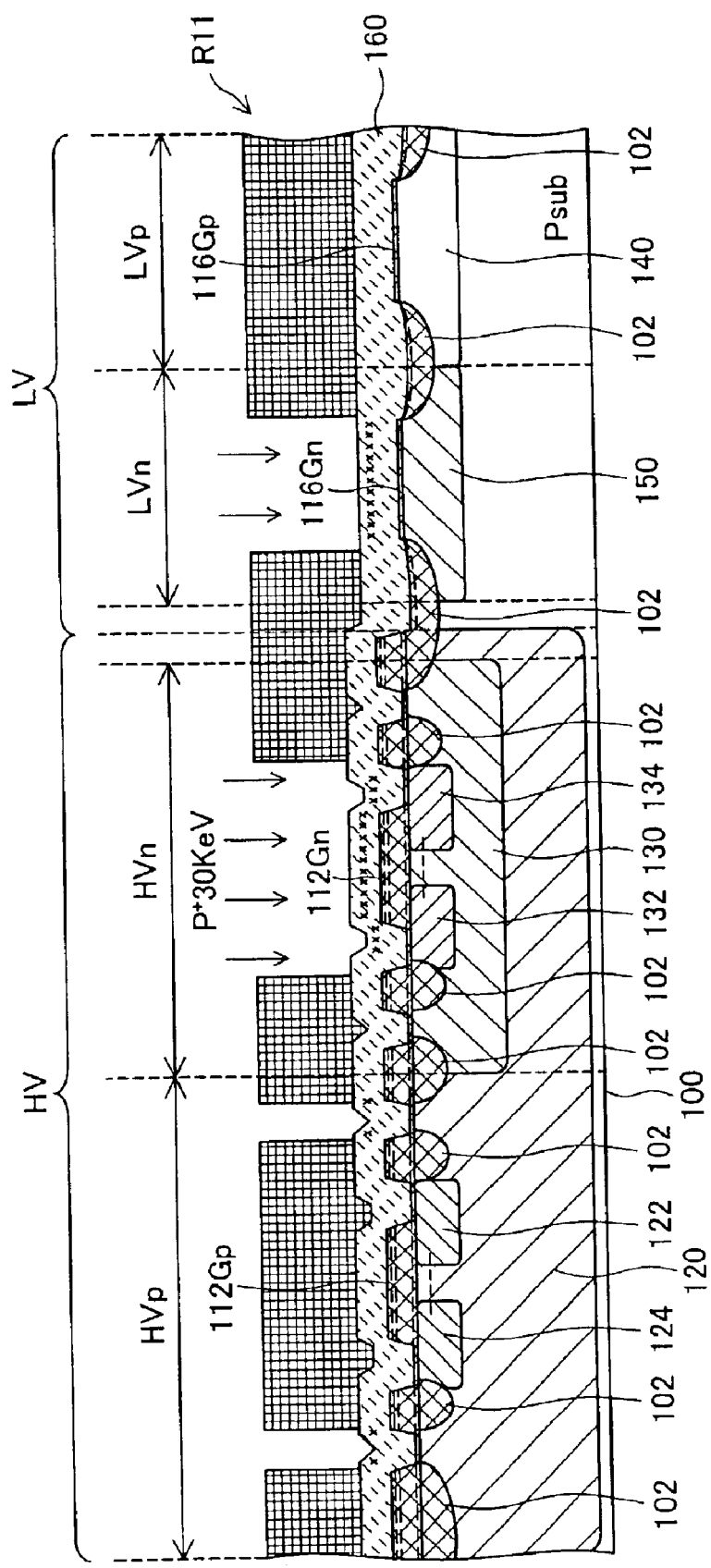
FIG. 17 is a sectional view schematically illustrating a process of forming gate electrodes of the high-breakdown-voltage transistor and the low-breakdown-voltage transistor.
Figure 18:
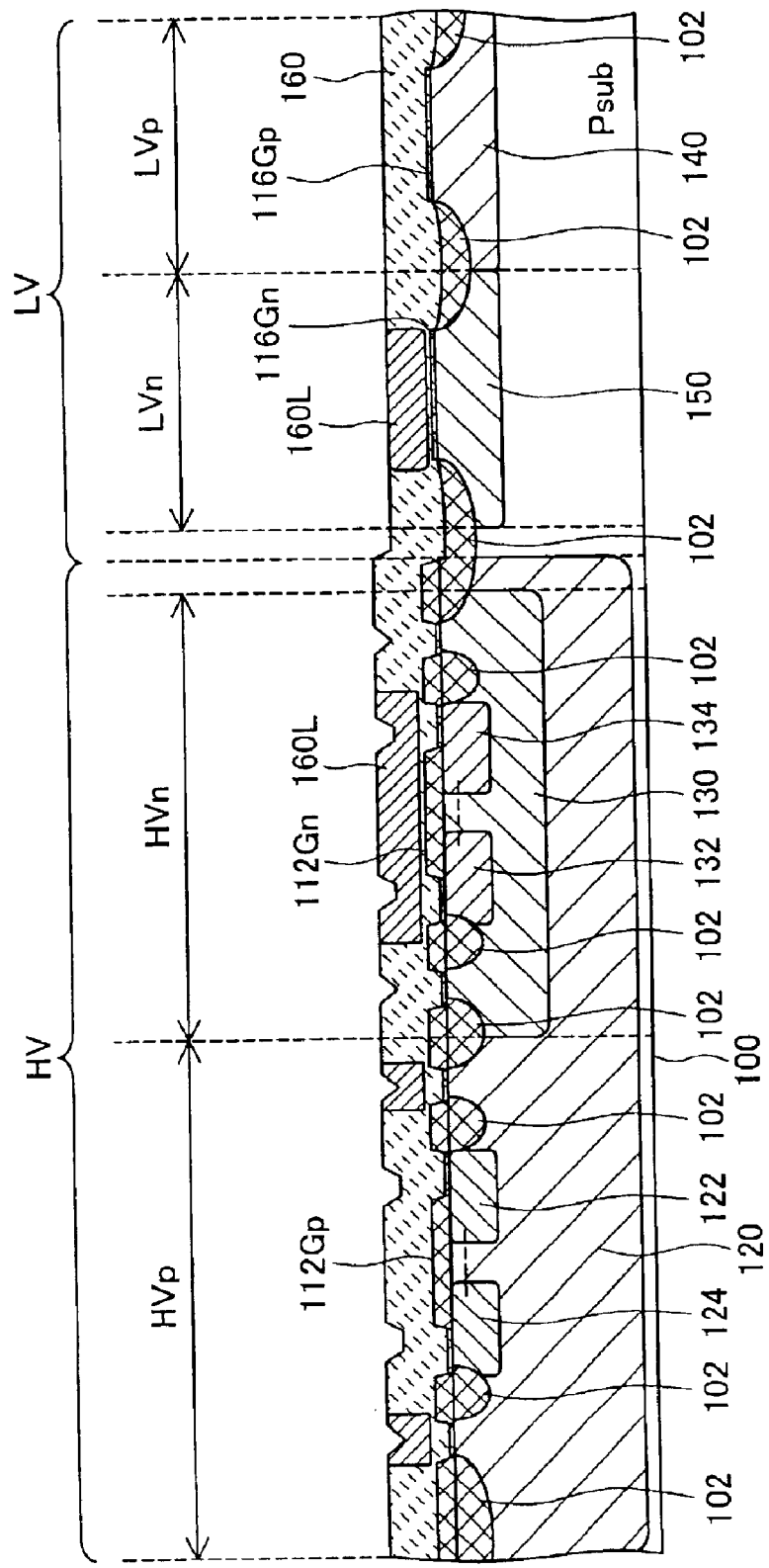
FIG. 18 is a sectional view schematically illustrating the process of forming the gate electrodes of the high-breakdown-voltage transistor and the low-breakdown-voltage transistor.
Figure 19:
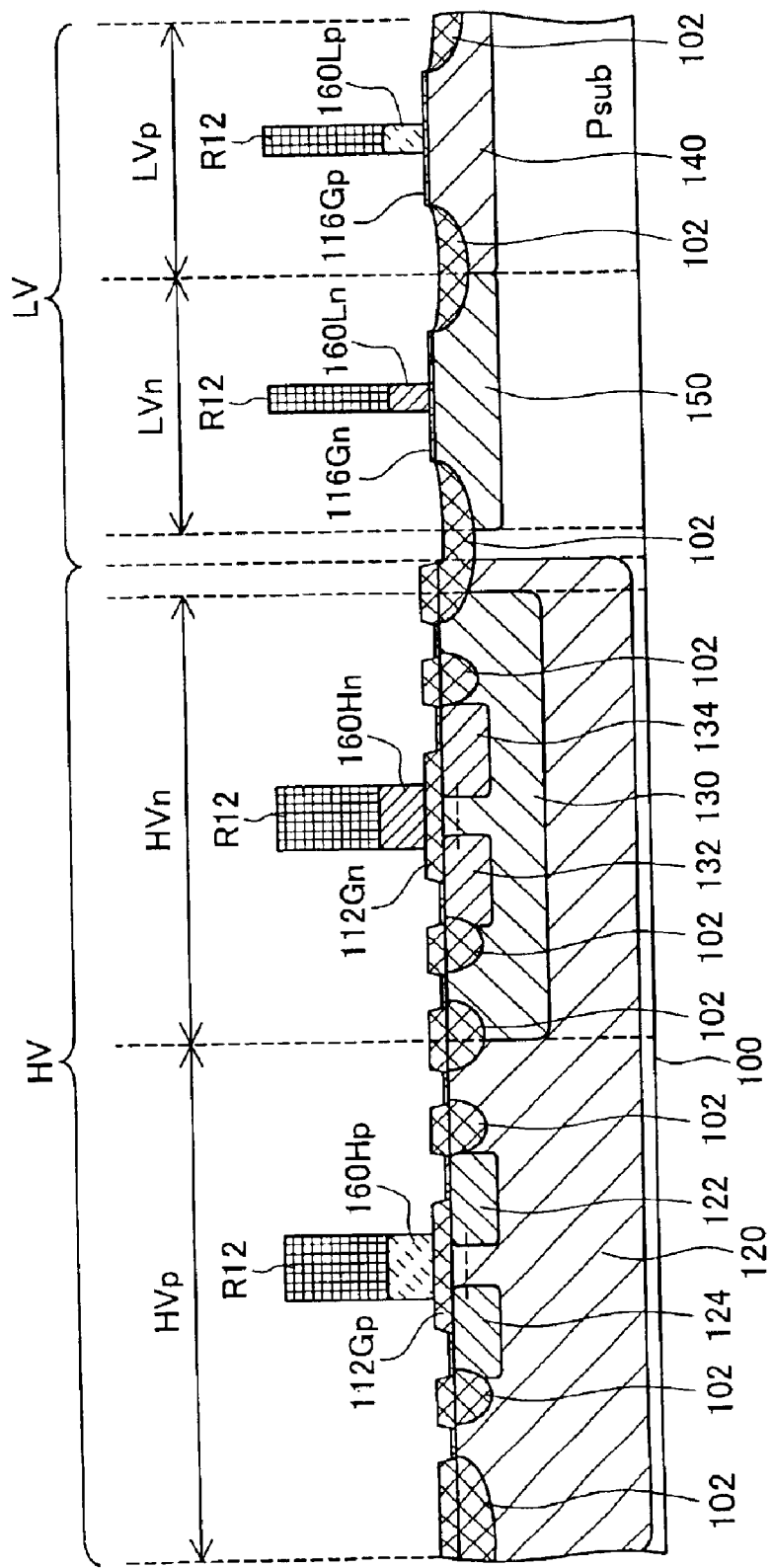
FIG. 19 is a sectional view schematically illustrating the process of forming the gate electrodes of the high-breakdown-voltage transistor and the low-breakdown-voltage transistor.

The procedure subsequently forms gate electrodes of the high-breakdown-voltage transistor and the low-breakdown-voltage transistor. FIGS. 17 through 19 are sectional views schematically illustrating a process of forming gate electrodes of the high-breakdown-voltage transistor and the low-breakdown-voltage transistor.

Referring to FIG. 17, the procedure makes a polysilicon (polySi) film 160 for gate electrodes deposit over the whole surface of the substrate 100, and forms an eleventh resist R11 on a remaining area other than gate electrode-forming areas of the high-breakdown-voltage nMOS and the low-breakdown-voltage nMOS. The procedure subsequently implants an n-type impurity ion into the opening of the eleventh resist R11, that is, into the polySi film 160 in the gate electrode-forming areas of the high-breakdown-voltage nMOS and the low-breakdown-voltage nMOS. In this example, phosphorus ion ($P^+$) having an energy level of 30 keV is implanted. The procedure then removes the eleventh resist R11 and carries out heat treatment to diffuse the implanted n-type impurity ion (phosphorus) as shown in FIG. 18.

The procedure then forms a twelfth resist R12 on the gate electrode-forming areas of the respective transistors as shown in FIG. 19, and removes non-required portions of the polySi film 160, which are not protected by the twelfth resist R12, by etching. This gives a gate electrode 160Hp of the high-breakdown-voltage pMOS, a gate electrode 160Hn of the high-breakdown-voltage nMOS, a gate electrode 160Lp of the low-breakdown-voltage pMOS, and a gate electrode 160Ln of the low-breakdown-voltage nMOS.

The resistance of the polySi material is higher than those of general metal materials applicable for the electrodes. In the case where the polySi material is applied for the gate electrodes, impurity ions adequate for the respective channels should be implanted to lower the resistance. In a process of FIG. 24 discussed later, an n-type impurity ion is implanted into drain and source areas of the nMOS as well as into corresponding gate electrodes. The quantity of ion implantation in this process is, however, not sufficient for the gate electrodes of the nMOS and can not sufficiently lower the resistance. The process shown in FIGS. 17 and 18 thus preliminarily lowers the resistance of polySi areas 160L corresponding to the gate electrodes of the nMOS.

The eleventh resist R11 in FIG. 17 has the opening not only in the portions corresponding to the gate electrode-forming areas but in portions corresponding to non-gate electrode-forming areas. This is because the resist R11 is identical with a resist mask used in the process of ion implantation into the drain and source areas as discussed later with reference to FIG. 24. Such opening, however, does not cause any problems, since the polySi film in the portions corresponding to the non-gate electrode-forming areas is removed by etching as shown in FIG. 19. An exclusive resist mask may alternatively be used not to make the opening of the eleventh resist R11 in the portions corresponding to the non-gate electrode-forming areas.

Figure 20:
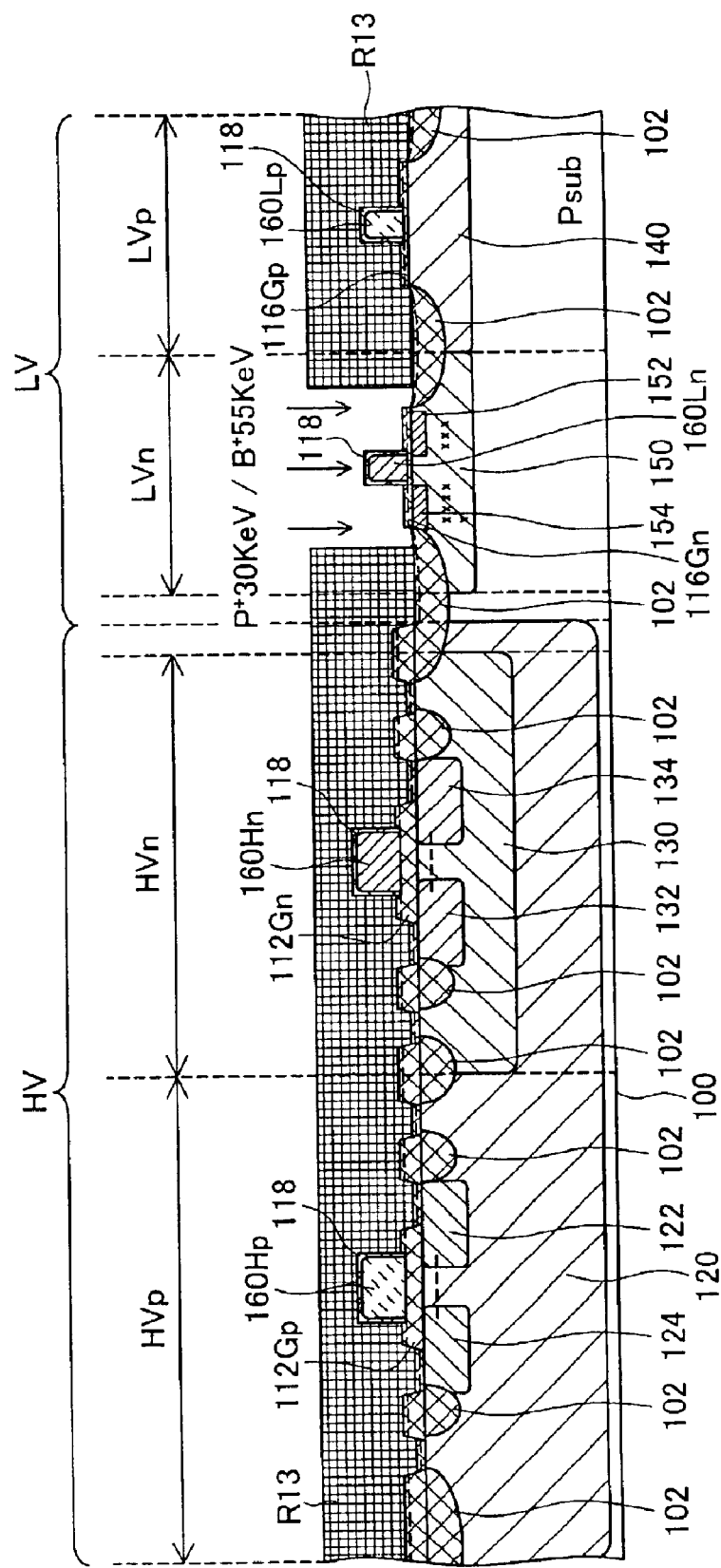
FIG. 20 is a sectional view schematically illustrating a process of forming source and drain offset areas of the low-breakdown-voltage nMOS.

The procedure then forms source and drain offset areas of the low-breakdown-voltage nMOS on the substrate surface side of the p well 150. FIG. 20 is a sectional view schematically illustrating a process of forming source and drain offset areas of the low-breakdown-voltage nMOS.

As shown in FIG. 20, the procedure forms a fifth oxide film 118 over the whole surface of the substrate 100 by thermal oxidation. The procedure then forms a thirteenth resist R13 on a remaining area other than the low-breakdown-voltage nMOS area LVn and implants an n-type impurity ion into a shallower portion of the p well 150. In this example, phosphorus ion ($P^+$) having an energy level of 30 keV is implanted as the n-type impurity ion. This makes a drain offset area 152 and a source offset area 154 for formation of a drain area and a source area.

The procedure subsequently implants a p-type impurity ion into a deeper portion of the p well 150. In this example, boron ion ($B^+$) having an energy level of 55 keV is implanted as the p-type impurity ion. The concentration of the n-type impurity ion in the deeper portion of the p well 150 is accordingly less than that in the shallower portion of the p well 150. Such arrangement of the p well 150 attains a relatively high level of withstanding breakdown voltage between electrodes of the low-breakdown-voltage nMOS.

Figure 21:
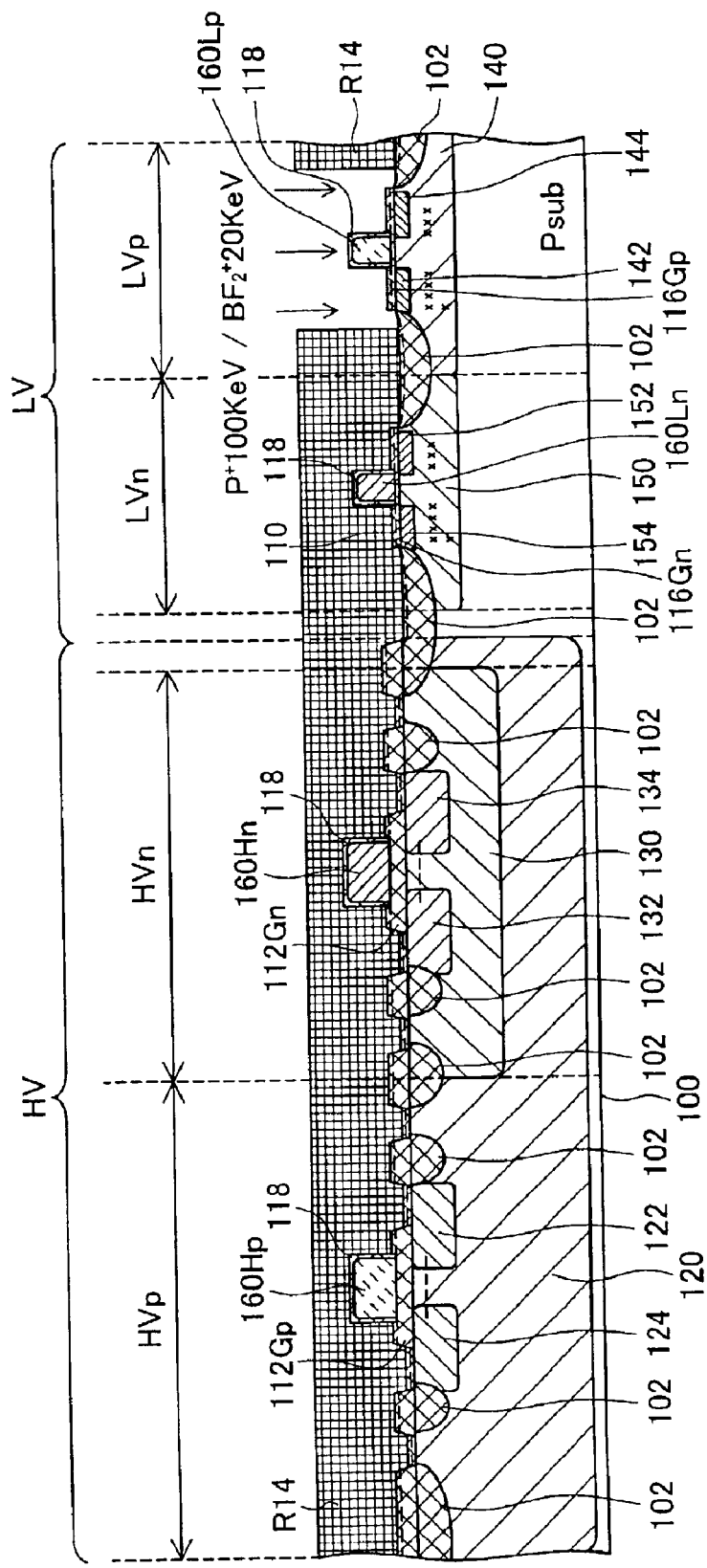
FIG. 21 is a sectional view schematically illustrating a process of forming source and drain offset areas of the low-breakdown-voltage pMOS.

The procedure then forms a source offset area and a drain offset area of the low-breakdown-voltage pMOS on the substrate surface side of the n well 140. FIG. 21 is a sectional view schematically illustrating a process of forming source and drain offset areas of the low-breakdown-voltage pMOS.

As shown in FIG. 21, the procedure forms a fourteenth resist R14 on a remaining area other than the low-breakdown-voltage pMOS area LVp and implants a p-type impurity ion into a shallower portion of the n well 140. In this example, boron fluoride ion ($BF_2^+$) having an energy level of 20 keV is implanted as the p-type impurity ion. This makes a drain offset area 142 and a source offset area 144 for formation of a drain area and a source area.

The procedure subsequently implants an n-type impurity ion into a deeper portion of the n well 140. In this example, phosphorus ion ($P^+$) having an energy level of 100 keV is implanted as the n-type impurity ion. The concentration of the p-type impurity ion in the deeper portion of the n well 140 is accordingly less than that in the shallower portion of the n well 140. Such arrangement of the n well 140 attains a relatively high level of withstanding breakdown voltage between electrodes of the low-breakdown-voltage pMOS.

The process of forming the offset areas of the low-breakdown-voltage nMOS shown in FIG. 20 and the process of forming the offset areas of the low-breakdown-voltage pMOS shown in FIG. 21 may be carried out in the reverse order.

Figure 22:
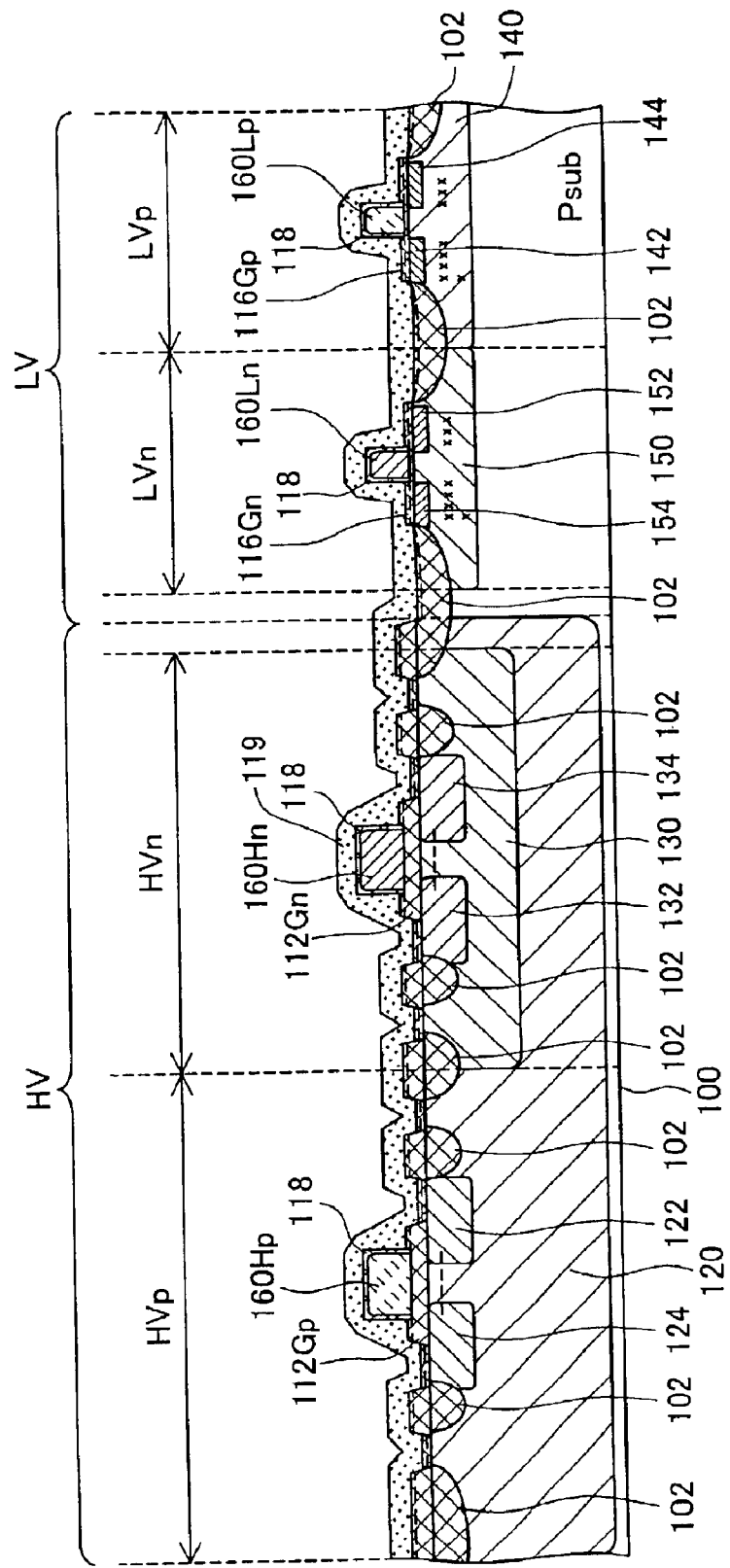
FIG. 22 is a sectional view schematically illustrating a process of forming side walls.
Figure 23:
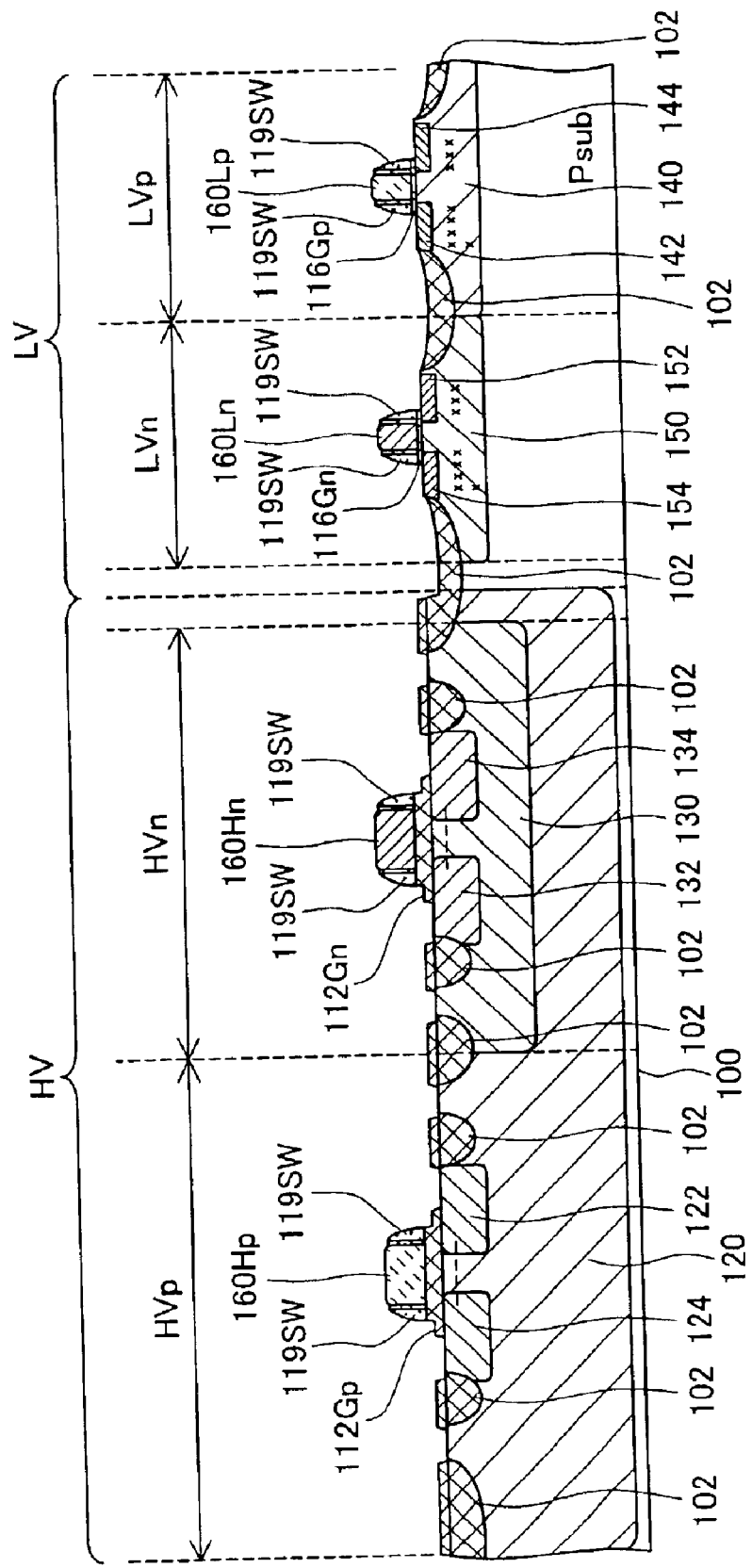
FIG. 23 is a sectional view schematically illustrating the process of forming the side walls.

The procedure subsequently forms side walls on the side face of the gate electrode 160Ln of the low-breakdown-voltage nMOS and the gate electrode 160Lp of the low-breakdown-voltage pMOS as the mask for formation of the source area and the drain area. FIGS. 22 and 23 are sectional views schematically illustrating a process of forming side walls.

The procedure forms a sixth oxide film 119 over the whole surface of the substrate 100 as shown in FIG. 22, and etches back to completely remove the fifth oxide film 118 and the sixth oxide film 119 covering over the gate electrodes 160Hp, 160Hn, 160Lp, and 160Ln of the respective transistors as shown in FIG. 23. Side walls 119SW of the fifth oxide film 118 and the sixth oxide film 119 are accordingly made on the side face of the gate electrodes 160Lp and 160Ln of the low-breakdown-voltage pMOS and the low-breakdown-voltage nMOS. In a similar manner, the side walls 119SW are also made on the side face of the gate electrodes 160Hn and 160Hp of the high-breakdown-voltage nMOS and the high-breakdown-voltage pMOS.

Figure 24:
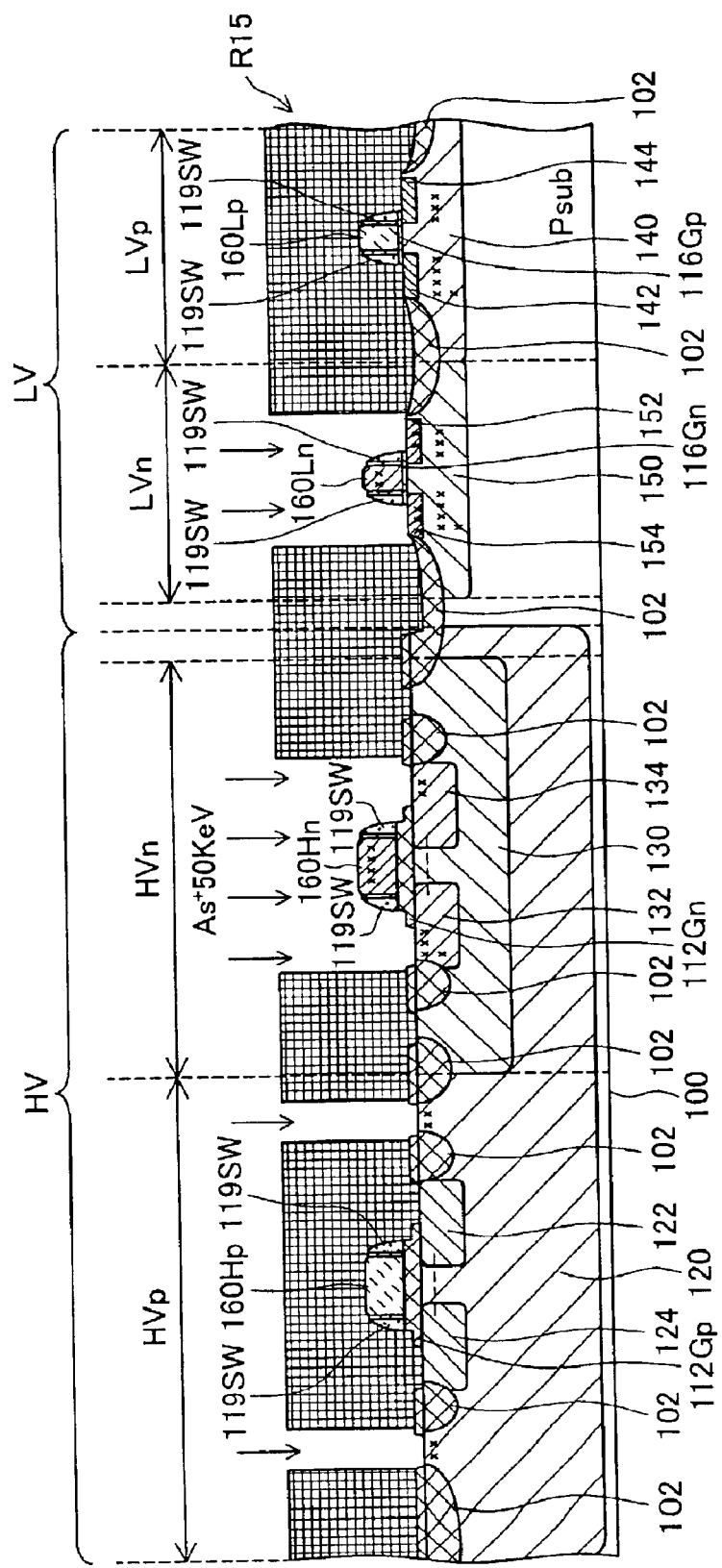
FIG. 24 is a sectional view schematically illustrating a process of specifying source areas and drain areas of the high-breakdown-voltage transistor and the low-breakdown-voltage transistor.
Figure 25:
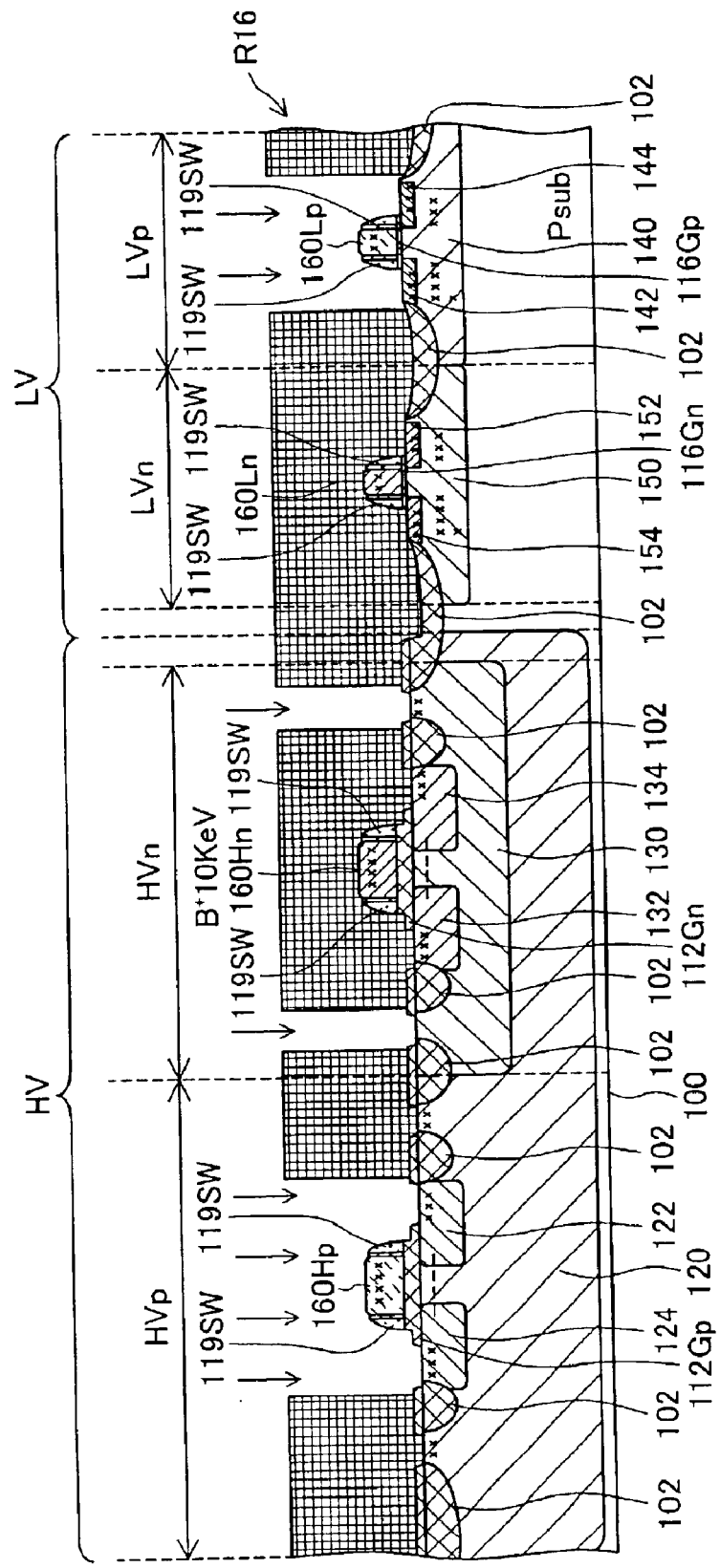
FIG. 25 is a sectional view schematically illustrating the process of specifying the source areas and the drain areas of the high-breakdown-voltage transistor and the low-breakdown-voltage transistor.
Figure 26:
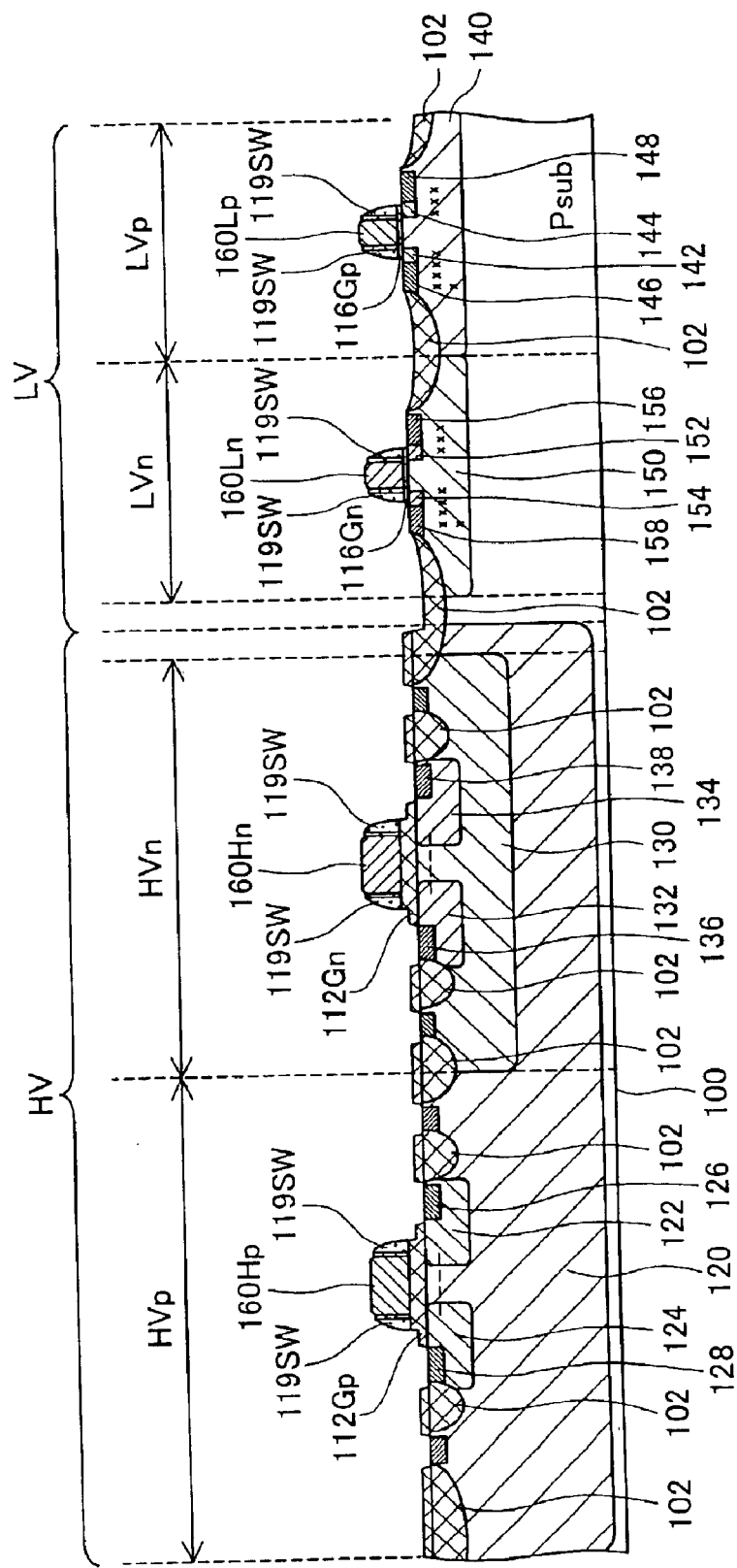
FIG. 26 is a sectional view schematically illustrating the process of specifying the source areas and the drain areas of the high-breakdown-voltage transistor and the low-breakdown-voltage transistor.

The procedure subsequently forms source areas and drain areas of the high-breakdown-voltage transistor and the lowbreakdown-voltage transistor. FIGS. 24 through 26 are sectional views schematically illustrating a process of specifying source areas and drain areas of the high-breakdown-voltage transistor and the low-breakdown-voltage transistor.

The procedure first forms a fifteenth resist R15 on a remaining area other than the element-forming regions of the high-breakdown-voltage nMOS area HVn and the low-breakdown-voltage nMOS area LVn as shown in FIG. 24. The procedure then implants an n-type impurity ion with the fifteenth resist R15, the gate electrodes 160Hn and 160Ln, and the side walls 119SW as the mask. In this example, arsenic ion (As$^+$) having an energy level of 50 keV is implanted.

The procedure forms a sixteenth resist R16 on a remaining area other than the element-forming regions of the high-breakdown-voltage pMOS area HVp and the low-breakdown-voltage pMOS area LVp as shown in FIG. 25. The procedure then implants a p-type impurity ion with the sixteenth resist R16, the gate electrodes 160Hp and 160Lp, and the side walls 119SW as the mask. In this example, boron ion (B$^+$) having an energy level of 10 keV is implanted.

The ion implantation process shown in FIG. 24 and the ion implantation process shown in FIG. 25 may be carried out in the reverse order.

High-temperature heat treatment is carried out for a long time period to diffuse the implanted impurity ions and thereby form a drain area 126 and a source area 128 of the high-breakdown-voltage pMOS, a drain area 136 and a source area 138 of the high-breakdown-voltage nMOS, a drain area 146 and a source area 148 of the low-breakdown-voltage pMOS, and a drain area 156 and a source area 158 of the low-breakdown-voltage nMOS as shown in FIG. 26.

Since the n-type impurity ion is implanted into the gate electrodes 160Hn and 160Ln of the nMOS and the p-type impurity ion is implanted into the gate electrodes 160Hp and 160Lp of the pMOS as shown in FIGS. 24 and 25, the respective gate electrodes 160Hn, 160Ln, 160Hp, and 160Lp have the reduced resistances.

The impurity ions are also implanted into portions between the LOCOS film-parts 102 other than the nMOS- and pMOS-forming regions in the high-breakdown-voltage transistor area HV as shown in FIGS. 24 and 25. Such implantation prevents incomplete isolation of the elements, due to parasitic generation of channels in the portions between the LOCOS film-parts 102.

Figure 27:
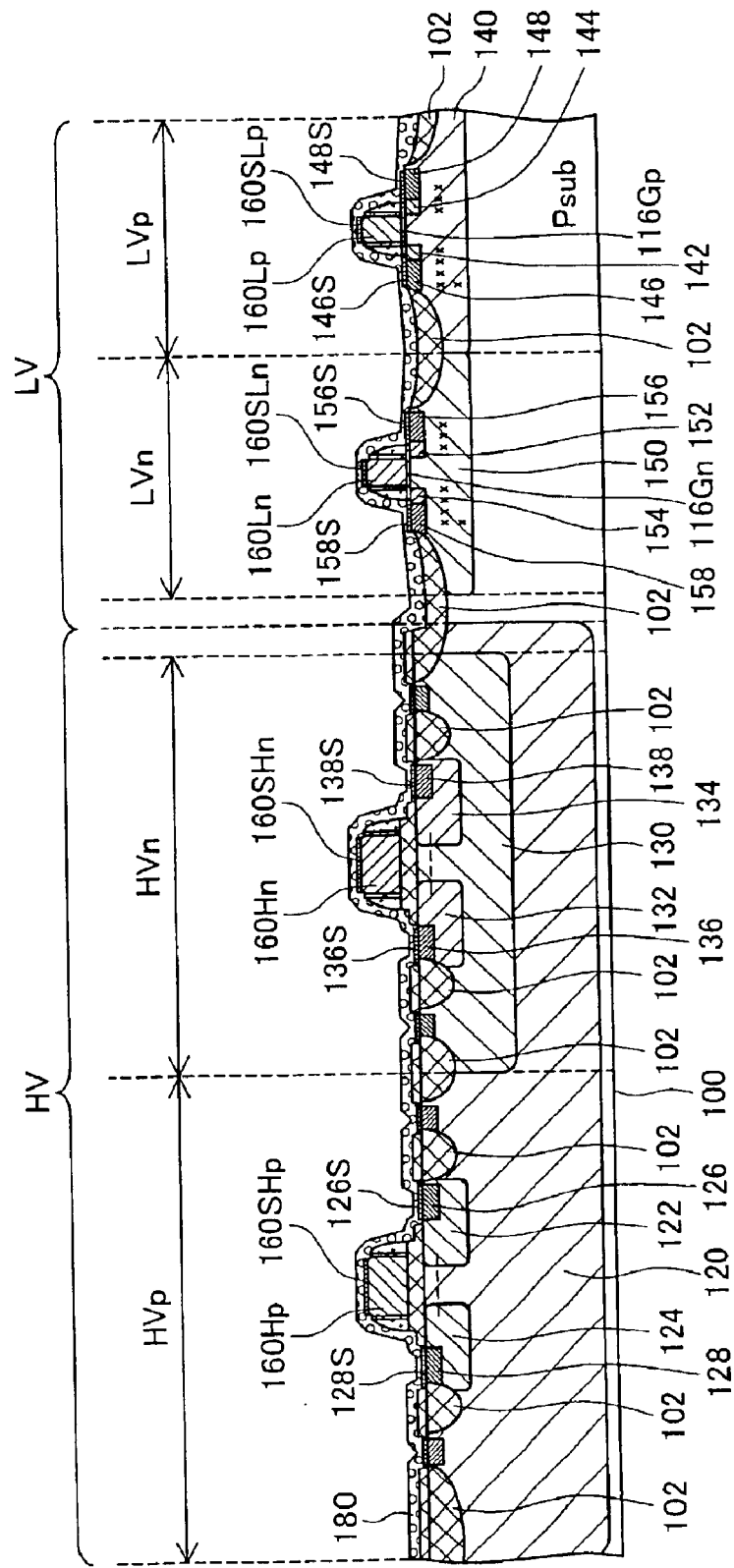
FIG. 27 is a sectional view schematically illustrating a silicidation process.
Figure 28:
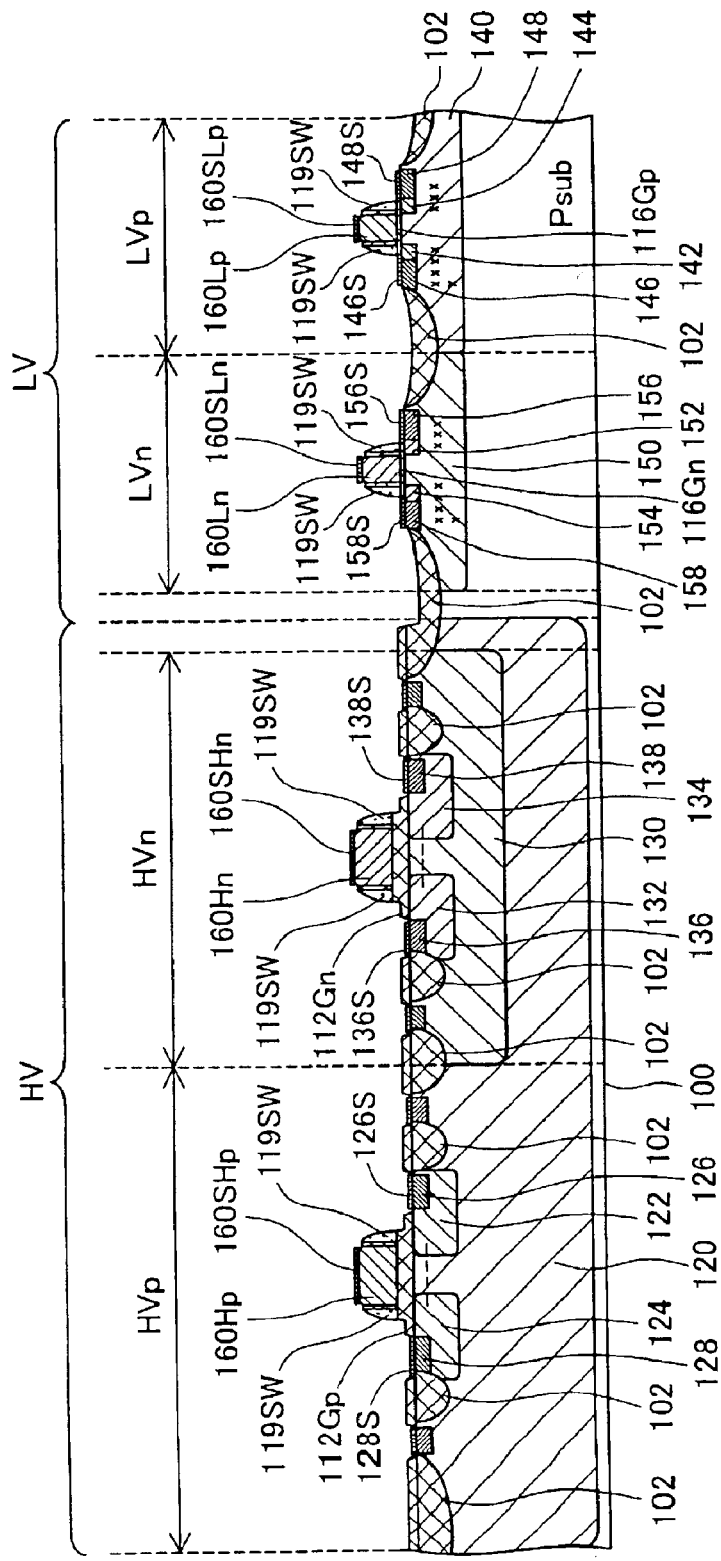
FIG. 28 is a sectional view schematically illustrating the silicidation process.

The procedure subsequently silicidates the surface of the drain, gate, and source areas of the respective transistors. FIGS. 27 and 28 are sectional views schematically illustrating a silicidation process.

A titanium (Ti) film 180 is formed over the whole surface of the substrate 100 by sputtering as shown in FIG. 27. High-temperature heat treatment is carried out for a long time period for silicidation of contact areas 160SHp, 160SHn, 160SLp, 160SLn, 126S, 136S, 146S, 156S, 128S, 138S, 148S, and 158S of the gates 160Hp, 160Hn, 160Lp, and 160Ln, the drains 126, 136, 146, and 156, and the sources 128, 138, 148, and 158 of the respective transistors, which are in contact with the titanium film 180. The non-silicidated titanium film 180 is removed in a self-aligning manner as shown in FIG. 28.

A required series of processes (not shown) including a wiring process are performed after the respective processes shown in FIGS. 1 through 28. This procedure efficiently manufactures a semiconductor device, in which both the high-breakdown-voltage transistor and the low-breakdown-voltage transistor are formed on the identical substrate 100.

Figure 29A:
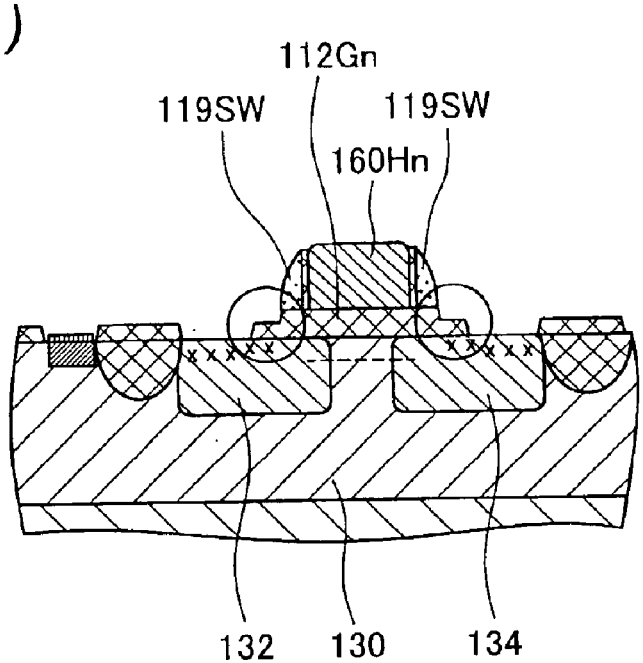
FIG. 29 is a sectional view schematically illustrating the structural features of the high-breakdown-voltage nMOS manufactured according to the basic manufacturing process.
Figure 29B:
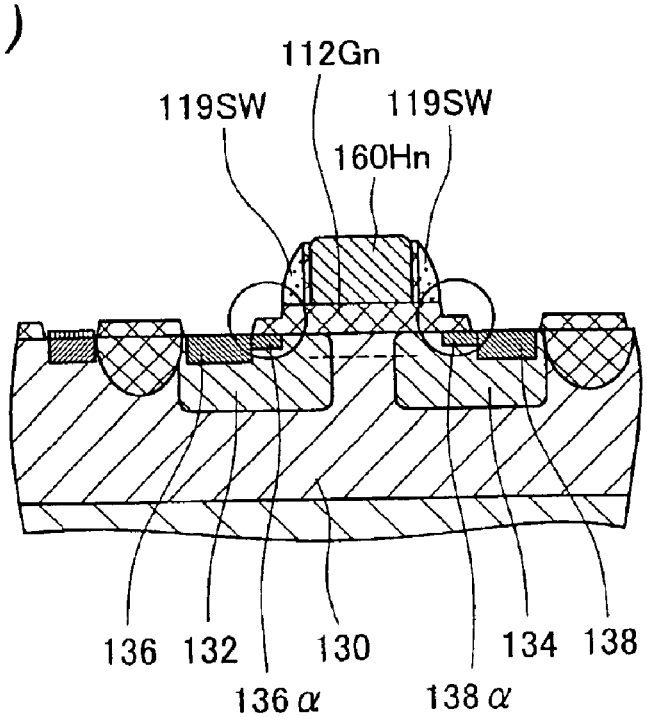
Figure 30:
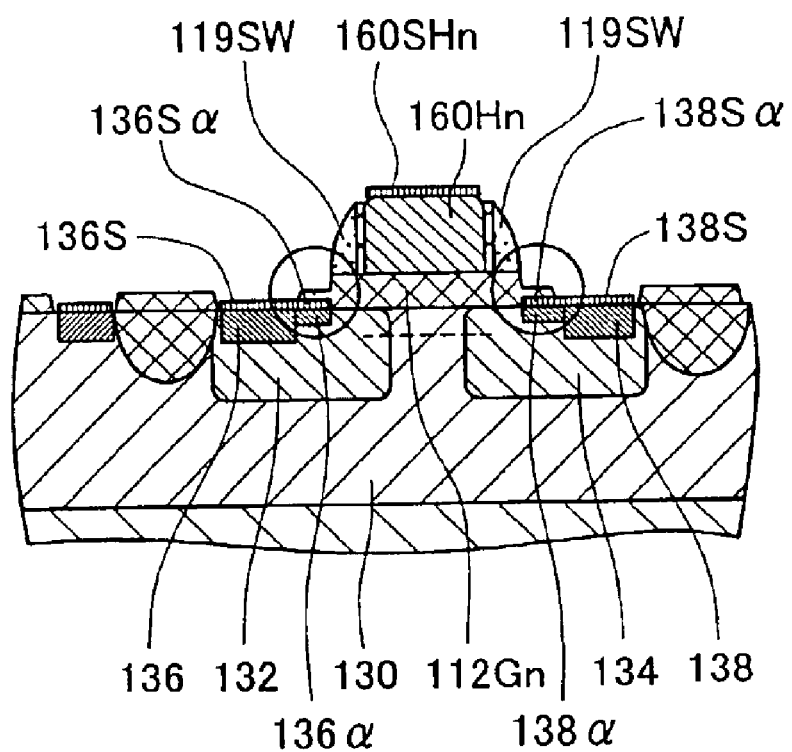
FIG. 30 is a sectional view schematically illustrating the structural features of the high-breakdown-voltage nMOS manufactured according to the basic manufacturing process.

B. Structural Features of High-Breakdown-Voltage Transistor Manufactured according to Basic Manufacturing Process FIGS. 29 and 30 are sectional views schematically illustrating structural features of the high-breakdown-voltage nMOS manufactured according to the basic manufacturing process described above. A gate oxide film 112Gn of the high-breakdown-voltage nMOS is over-etched in the process of forming the side wall 119SW shown in FIGS. 22 and 23. A peripheral portion (encircled portion) of the gate oxide film 112Gn without the side fall 119SW accordingly has the less thickness than the thickness of its center portion as shown in FIG. 29(A). The impurity ion is accordingly implanted into under-layer offset areas below the peripheral portion (encircled portion) of the gate oxide film 112Gn as shown in FIG. 29(A) in the process of implanting the impurity ion into the offset areas 132 and 134 shown in FIGS. 24 and 25. The heat treatment process shown in FIG. 26 diffuses the implanted impurity ion, so that an additional drain area 136α and an additional source area 138α are formed below the peripheral portion (encircled portion) of the gate oxide film 112Gn as shown in FIG. 29(B). Such formation narrows the distance between the drain area and the source area and may lower the level of withstanding breakdown voltage between the electrodes.

In the silicidation process of FIG. 27, surface regions 136Sα and 138Sα of the under-layer offset areas 136α and 138α below the peripheral portion (encircled portion) of the gate oxide film 112Gn may be silicidated as shown in FIG. 30. Such silicidation also narrows the distance between the drain area and the source area and may lower the level of withstanding breakdown voltage between the electrodes. The peripheral portion (encircled portion) of the gate oxide film 112Gn has the less thickness than the thickness of its center portion. The silicidation may thus occur in the thinner peripheral portion even when the under-layer offset areas 136α and 138α below the peripheral portion of the gate oxide film 112Gn are protected from implantation of the impurity and no additional drain area nor additional source area is formed.

The high-breakdown-voltage pMOS has structural features similar to those of the high-breakdown-voltage nMOS, and is not specifically described here.

As described above, in the high-breakdown-voltage transistor manufactured according to the basic manufacturing process, the gate oxide film is over-etched in the process of forming the side wall on the gate electrode of the low-breakdown-voltage transistor. Such over-etching may lower the level of withstanding breakdown voltage between the electrodes.

C. Manufacturing Process in Embodiment

Figure 33:
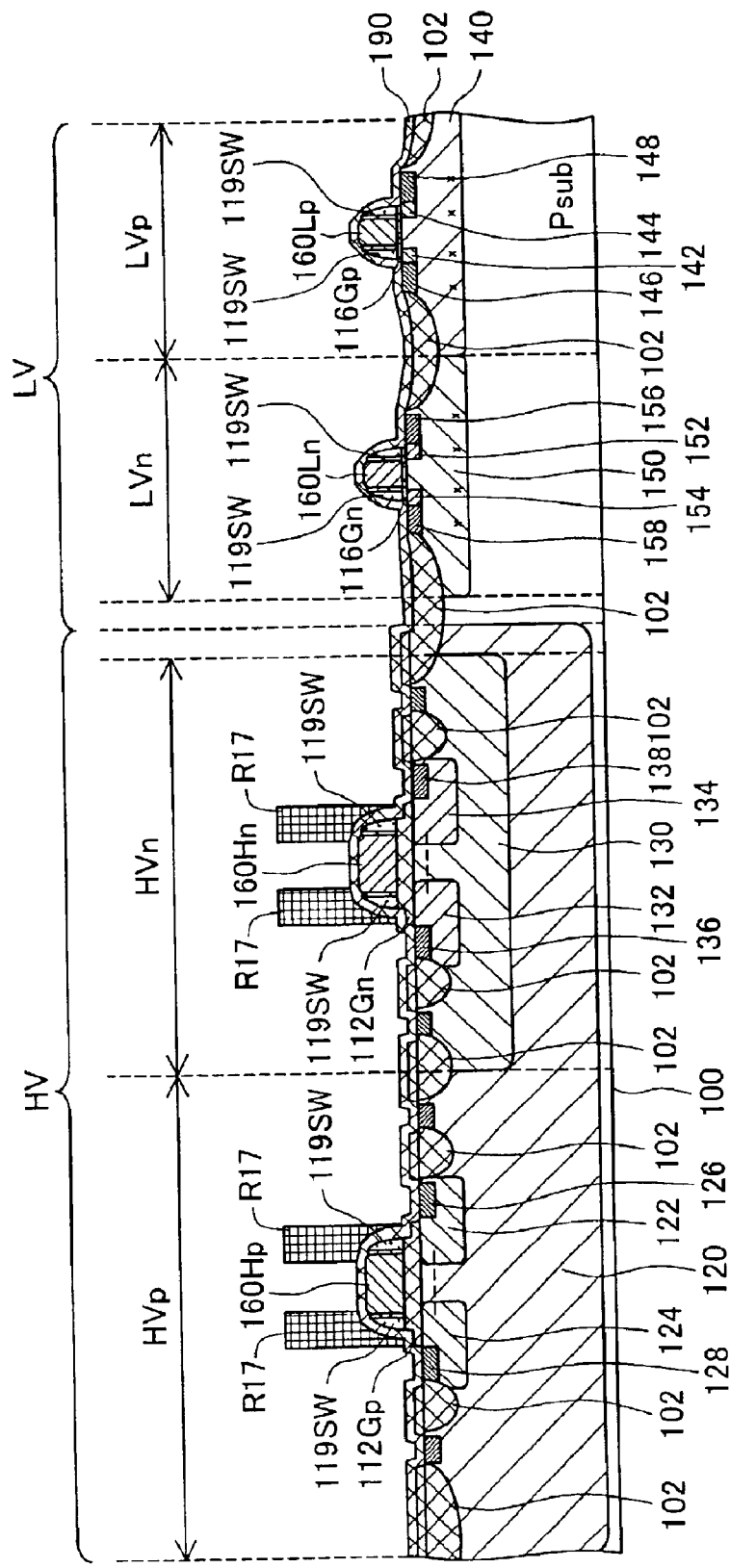
FIG. 33 is a sectional view schematically illustrating a process of forming protective oxide films for protecting a gate oxide film 112Gn and a side wall 119SW of the high-breakdown-voltage nMOS and a gate oxide film 112Gp and a side wall 119SW of the high-breakdown-voltage pMOS.
Figure 34:
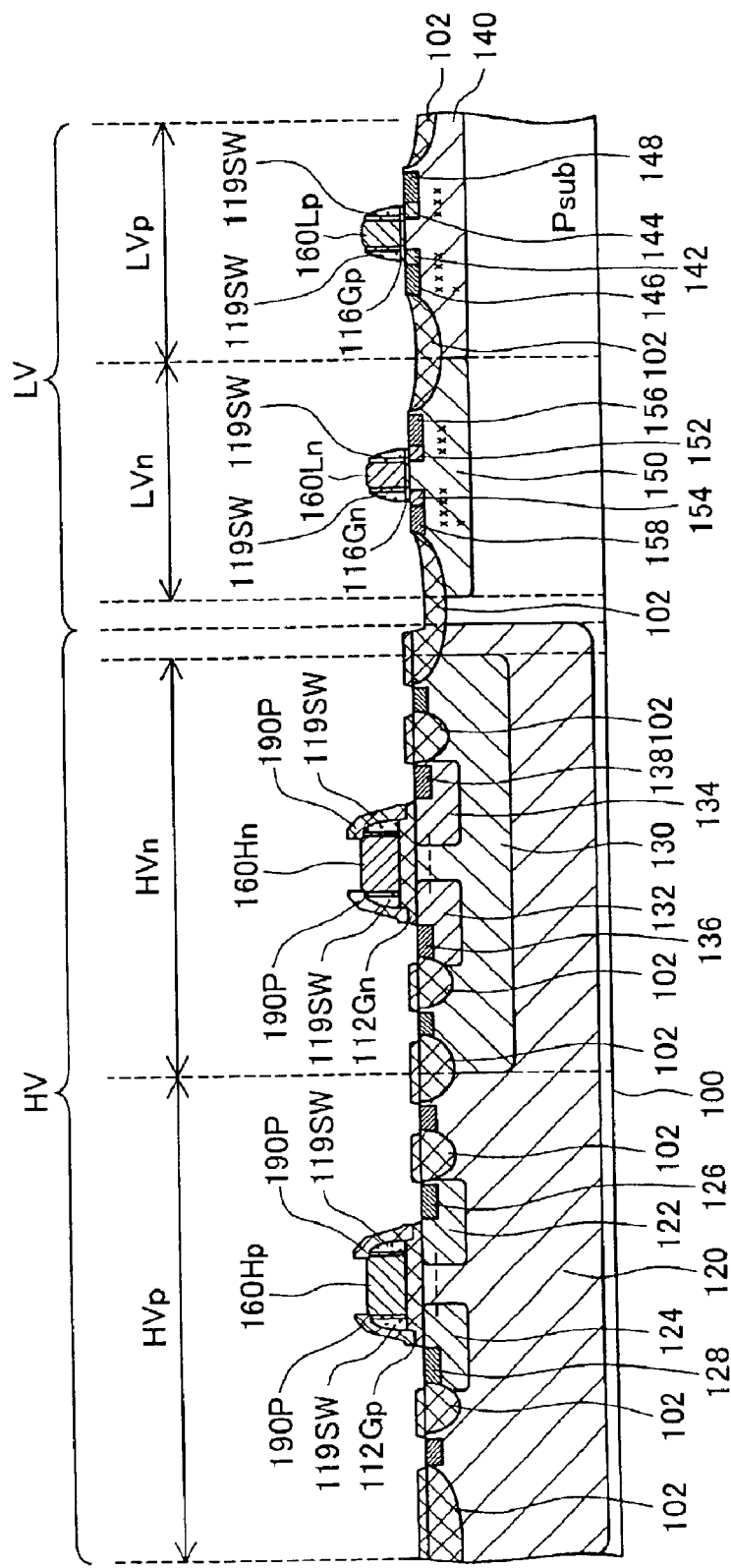
FIG. 34 is a sectional view schematically illustrating the process of forming the protective oxide films for protecting the gate oxide film 112Gn and the side wall 119SW of the high-breakdown-voltage nMOS and the gate oxide film 112Gp and the side wall 119SW of the high-breakdown-voltage pMOS.

The manufacturing process of the semiconductor device in one embodiment of the present invention is described below, in comparison with the basic manufacturing process discussed above. The manufacturing process in the embodiment is similar to the basic manufacturing process, except that the processes of FIGS. 24 and 25 are replaced by processes shown in FIGS. 31 and 32 and that processes shown in FIGS. 33 and 34 are added prior to the process of FIG. 27.

Figure 31:
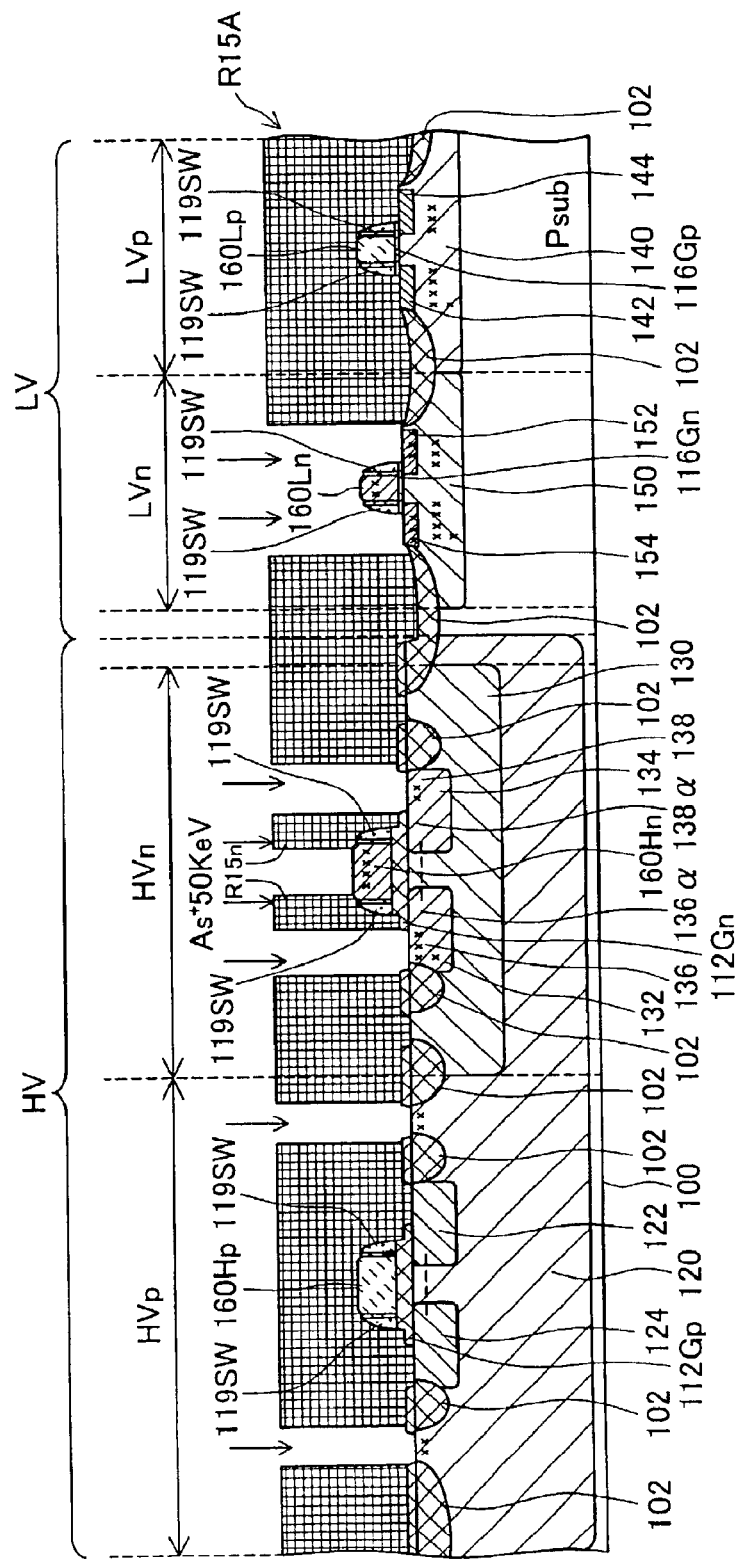
FIG. 31 is a sectional view schematically illustrating a process of specifying source areas and drain areas of the high-breakdown-voltage nMOS and the low-breakdown-voltage nMOS.

FIG. 31 is a sectional view schematically illustrating a process of specifying source areas and drain areas of the high-breakdown-voltage nMOS and the low-breakdown-voltage nMOS. The fifteenth resist R15 used in the process of FIG. 24 is replaced by a resist R15A in the process of FIG. 31. The resist R15A includes a resist R15n, which is formed to cover at least the gate oxide film 112Gn and the side wall 119SW of the high-breakdown-voltage nMOS area HVn. The resist R15n functions as the mask to prevent implantation of the n-type impurity ion (arsenic in the process of FIG. 24) into the under-layer offset areas 136α and 138α of the thinner gate oxide film 112Gn (see FIG. 29).

Figure 32:
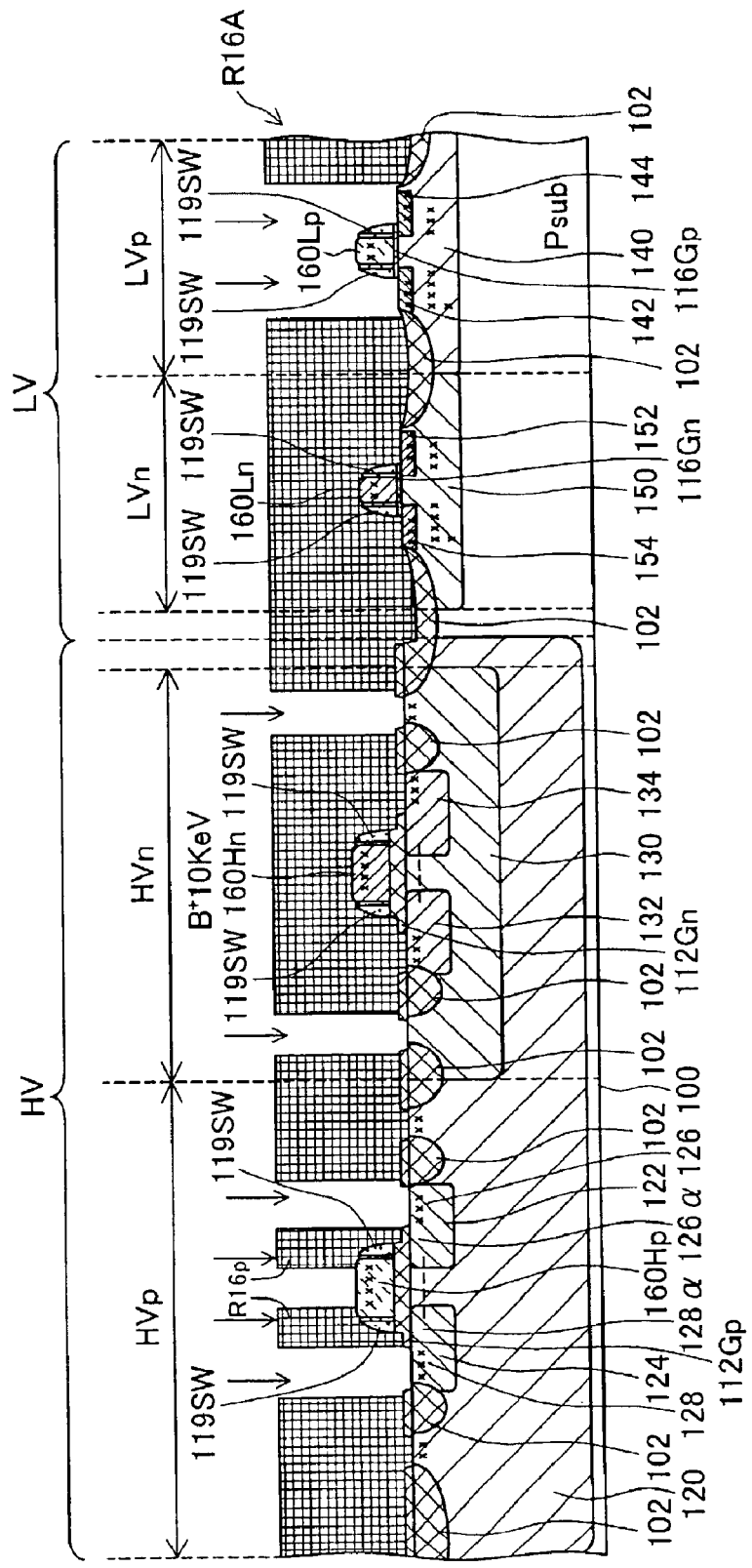
FIG. 32 is a sectional view schematically illustrating a process of specifying source areas and drains areas of the high-breakdown-voltage pMOS and the low-breakdown-voltage pMOS.

FIG. 32 is a sectional view schematically illustrating a process of specifying source areas and drain areas of the high-breakdown-voltage pMOS and the low-breakdown-voltage pMOS. The sixteenth resist R16 used in the process of FIG. 25 is replaced by a resist R16A in the process of FIG. 32. The resist R16A includes a resist R16p, which is formed to cover at least the gate oxide film 112Gp and the side wall 119SW of the high-breakdown-voltage pMOS area HVp. The resist R16p functions as the mask to prevent implantation of the p-type impurity ion (boron in the process of FIG. 25) into the under-layer offset areas 126α and 128α of the thinner gate oxide film 112Gp (see FIG. 29).

The resists R15n and R16p may be formed to further cover the peripheral ends of the respective electrodes 160Hn and 160Hp by taking into account the accuracy of their dimensions.

FIGS. 33 and 34 are sectional views schematically illustrating a process of forming a protective oxide film for protecting the gate oxide film 112Gn and the side wall 119SW of the high-breakdown-voltage nMOS and the gate oxide film 112Gp and the side wall 119SW of the high-breakdown-voltage pMOS.

The procedure makes a seventh oxide film 190 deposit over the whole surface of the substrate 100 as shown in FIG. 33. In this example, the seventh oxide film 190 is made to deposit in a thickness of approximately 700 angstrom. The procedure then forms a seventeenth resist R17 to cover the gate oxide film 112Gn and the side wall 119SW of the high-breakdown-voltage nMOS and the gate oxide film 112Gp and the side wall 119SW of the high-breakdown-voltage pMOS, and removes the seventh oxide film 190 other than the part covered with the seventeenth resist R17 by etching. This gives a protective oxide film 190P for protecting the gate oxide film 112Gn and the side wall 119SW of the high-breakdown-voltage nMOS and the gate oxide film 112Gp and the side wall 119SW of the high-breakdown-voltage pMOS as shown in FIG. 34.

The additional seventeenth resist R17 is formed to further cover the peripheral ends of the respective electrodes 160Hn and 160Hp by taking into account the accuracy of its dimensions. The protective oxide film 190P formed by etching accordingly covers the peripheral ends of the gate electrodes 160Hp and 160Hn.

The surface of the drain, gate, and source areas of the respective transistors is silicidated according to the process of FIGS. 27 and 28.

In the procedure of this embodiment, the thinner portions of the gate oxide films 112Gp and 112Gn are covered with and protected by the seventh oxide film 190 having the sufficient thickness of approximately 700 angstrom as shown in FIG. 33. The silicidation process of FIGS. 27 and 28 accordingly does not silicidate surface regions 126Sα, 128Sα, 136Sα, and 138Sα of under-layer offset areas 126α, 128α, 136α, and 138α of the thinner gate oxide films 112Gp and 112Gn shown in FIG. 31.

As discussed above, like the basic manufacturing process, the manufacturing process of this embodiment enables both the high-breakdown-voltage transistor and the low-breakdown-voltage transistor to be efficiently formed on the identical substrate 100. The manufacturing process of the embodiment has the additional advantage of preventing a decrease in withstanding breakdown voltage, which may occur in the basic manufacturing process.

Figure 35:
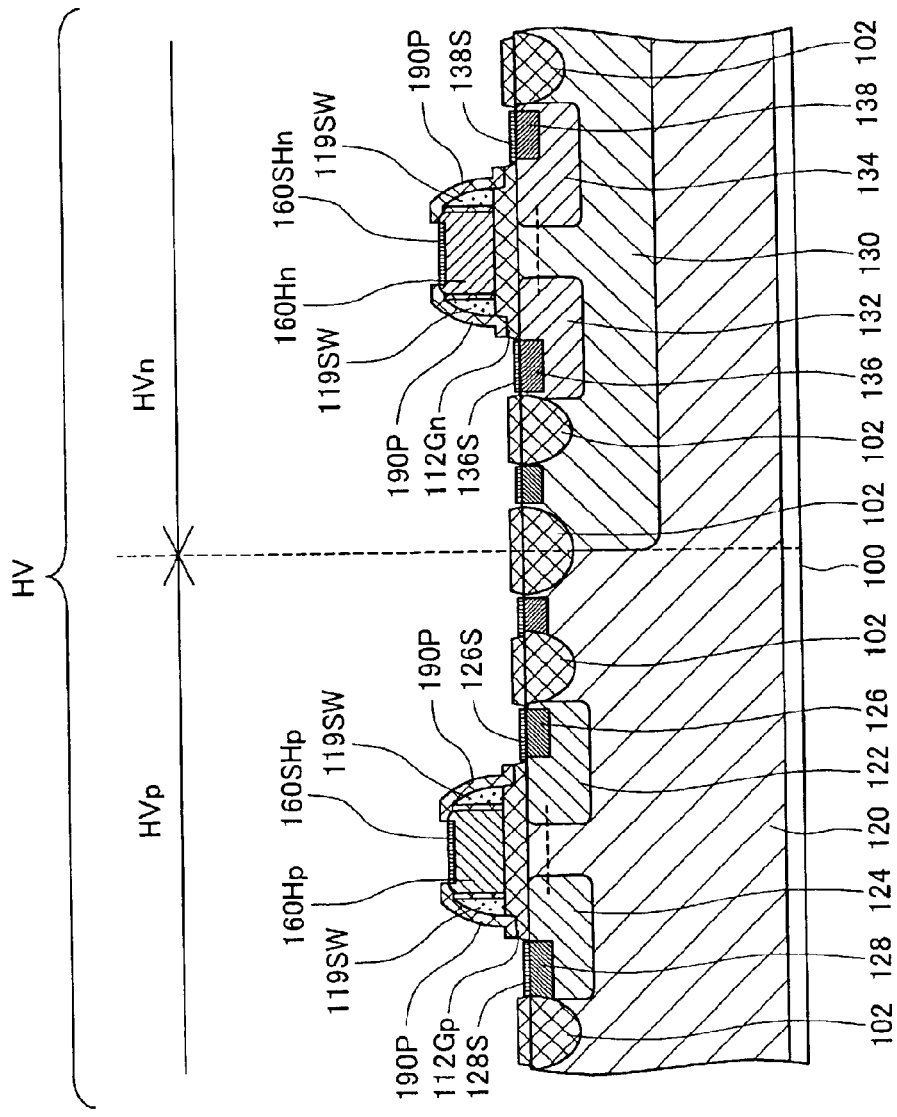
FIG. 35 is a sectional view schematically illustrating structural features of the high-breakdown-voltage transistor manufactured according to the manufacturing process in the embodiment.

FIG. 35 is a sectional view schematically illustrating the structural features of the high-breakdown-voltage transistor manufactured according to the manufacturing process in the embodiment. Referring to FIG. 35, the protective oxide film 190P is formed to cover the gate oxide film 112Gp and the side wall 119SW of the high-breakdown-voltage pMOS. The protective oxide film 190P is formed to further cover the peripheral end of the gate electrode 160Hp of the high-breakdown-voltage pMOS by taking into account the accuracy of dimensions, as discussed previously. The silicidated area 160SHp in the gate electrode 160Hp of the high-breakdown-voltage pMOS is accordingly only the opening not covered with the protective oxide film 190P. Namely there is a non-silicidated area in the peripheral end on the surface of the gate electrode 160Hp of the high-breakdown-voltage pMOS.

In a similar manner, the protective oxide film 190P is formed to cover the gate oxide film 112Gp and the side wall 119SW of the high-breakdown-voltage nMOS. The protective oxide film 190P is formed to further cover the peripheral end of the gate electrode 160Hn of the high-breakdown-voltage nMOS. The silicidated area 160SHn in the gate electrode 160Hn of the high-breakdown-voltage nMOS is accordingly only the opening not covered with the protective oxide film 190P. Namely there is a non-silicidated area in the peripheral end on the surface of the gate electrode 160Hn of the high-breakdown-voltage nMOS.

The above embodiment is to be considered in all aspects as illustrative and not restrictive. There may be many modifications, changes, and alterations without departing from the scope or spirit of the main characteristics of the present invention. All changes within the meaning and range of equivalency of the claims are therefore intended to be embraced therein.

For example, the procedure of the above embodiment forms an oxide film as the protective film for preventing the thinner portion of the gate oxide film from being silicidated. The protective film is, however, not restricted to the oxide film but may be any film adequately formed for protection, for example, a nitride film ($Si_3N_4$).

The scope and spirit of the present invention are indicated by the appended claims, rather than by the foregoing description.

What is claimed is:

1. A method of manufacturing a semiconductor device, in which a high-breakdown-voltage MOS transistor and a low-breakdown-voltage MOS transistor having different drain breakdown voltages are formed on an identical semiconductor substrate, the method comprising the steps of:

(1) creating a gate electrode on a center portion of a gate oxide film formed on the substrate, forming a silicon oxide film over the whole surface of the substrate including the gate electrode, and etching the whole face of the silicon oxide film, so as to form a side wall of the silicon oxide film on a side face of the gate electrode; and (2) implanting an impurity ion so as to specify a drain area and a source area; and (3) forming a metal film composed of a specific metal on the gate electrode, the drain area, and the source area and carrying out heat treatment to make respective semiconductor elements defining the gate electrode, the drain area, and the source area fused with the specific metal of the metal film for silicidation, wherein the step (2) comprises a step of forming a resist in advance on at least a peripheral portion of the gate oxide film in the high-breakdown-voltage MOS transistor, and wherein the step (3) comprises a step of forming a protective film in advance on at least the peripheral portion of the gate oxide film, so as to prevent silicidation of the semiconductor in the under layer region below the peripheral portion of the gate oxide film.

2. A method of manufacturing a semiconductor device, in which a high-breakdown-voltage MOS transistor and a low-breakdown-voltage MOS transistor having different drain breakdown voltages are formed on an identical semiconductor substrate, the method comprising the steps of:

(1) creating a gate electrode on a center portion of a gate oxide film formed on the substrate, forming a silicon oxide film over the whole surface of the substrate including the gate electrode, and etching the whole face of the silicon oxide film, so as to form a side wall of the silicon oxide film on a side face of the gate electrode;

(2) implanting an impurity ion so as to specify a drain area and a source area;

(3) forming a metal film composed of a specific metal on the gate electrode, the drain area, and the source area and carrying out heat treatment to make respective semiconductor elements defining the gate electrode, the drain area, and the source area fused with the specific metal of the metal film for silicidation, wherein the step (3) comprises a step of forming a protective film in advance on at least a peripheral portion of the gate oxide film in the high-breakdown-voltage MOS transistor, so as to prevent silicidation of the semiconductor in the under layer region below the peripheral portion of the gate oxide film.

* * * * *